(12) United States Patent
Takahashi

(10) Patent No.: US 6,781,199 B2
(45) Date of Patent: Aug. 24, 2004

(54) SEMICONDUCTOR DEVICE HAVING FIRST AND SECOND TRENCHES WITH NO CONTROL ELECTRODE FORMED IN THE SECOND TRENCH

(75) Inventor: Hideki Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,277

(22) Filed: Nov. 8, 2001

(65) Prior Publication Data

US 2002/0179976 A1 Dec. 5, 2002

(30) Foreign Application Priority Data

May 29, 2001 (JP) .................................... 2001-160160

(51) Int. Cl.⁷ ..................... H01L 29/76; H01L 29/94; H01L 31/062; H01L 31/113; H01L 31/119
(52) U.S. Cl. ........................... 257/330; 257/331
(58) Field of Search ................ 257/330, 331, 257/370, 371, 565

(56) References Cited

U.S. PATENT DOCUMENTS

| | | | |
|---|---|---|---|
| 5,623,152 A | * | 4/1997 | Majumdar et al. .......... 257/330 |
| 5,751,024 A | | 5/1998 | Takahashi |
| 5,801,408 A | | 9/1998 | Takahashi |
| 5,864,159 A | * | 1/1999 | Takahashi .................... 257/330 |
| 5,894,149 A | * | 4/1999 | Uenishi et al. .............. 438/133 |
| 5,960,264 A | * | 9/1999 | Takahashi .................... 438/133 |
| 5,981,981 A | | 11/1999 | Takahashi |
| 6,001,678 A | * | 12/1999 | Takahashi .................... 438/238 |
| 6,008,518 A | | 12/1999 | Takahashi |
| 6,040,599 A | | 3/2000 | Takahashi |
| 6,107,650 A | | 8/2000 | Takahashi et al. |
| 6,111,290 A | | 8/2000 | Uenishi et al. |
| 6,118,150 A | | 9/2000 | Takahashi |
| 6,198,130 B1 | | 3/2001 | Nobuto et al. |
| 6,218,217 B1 | | 4/2001 | Uenishi et al. |
| 6,221,721 B1 | | 4/2001 | Takahashi |
| 6,323,508 B1 | | 11/2001 | Takahashi et al. |
| 6,331,466 B1 | | 12/2001 | Takahashi et al. |
| 6,501,129 B2 | * | 12/2002 | Osawa ....................... 257/330 |
| 2003/0042575 A1 | * | 3/2003 | Takahashi et al. .......... 257/577 |

FOREIGN PATENT DOCUMENTS

| | | |
|---|---|---|
| JP | 8-222728 | 8/1996 |
| JP | 8-316479 | 11/1996 |
| JP | 9-331063 | 12/1997 |
| WO | WO 02/058160 | 7/2002 |

* cited by examiner

*Primary Examiner*—Mary Wilczewski
*Assistant Examiner*—Monica Lewis
(74) *Attorney, Agent, or Firm*—Oblon, Spivak, McClelland, Maier & Neustadt, P.C.

(57) ABSTRACT

It is an object to obtain a semiconductor device capable of minimizing an increase in a gate capacity without adversely influencing an operation characteristic and a method of manufacturing the semiconductor device. A first trench (7) and a second trench (11) are formed to reach an upper layer portion of an N⁻ layer (3) through a P base layer (5) and an N layer (4), respectively. In this case, a predetermined number of second trenches (11) are formed between the first trenches (7) and (7). The first trench (7) is provided adjacently to an N⁺ emitter region (6) and has a gate electrode (9) formed therein. The second trench (11) has a polysilicon region (15) formed therein. The second trench (11) is different from the first trench (7) in that the N⁺ emitter region (6) is not formed in a vicinal region and the gate electrode (9) is not formed therein. A trench space between the first trench (7) and the second trench (11) which are provided adjacently to each other is set to be such a distance as not to reduce a breakdown voltage. An emitter electrode (12) is directly formed on an almost whole surface of a base region (5).

25 Claims, 32 Drawing Sheets

SEMICONDUCTOR DEVICE HAVING FIRST AND SECOND TRENCHES WITH NO CONTROL ELECTRODE FORMED IN THE SECOND TRENCH

BACKGROUND OF THE INVENTION

1. Field of the Invention

The present invention relates to a semiconductor device, and more particularly to a semiconductor device comprising a bipolar transistor having an insulating gate and a method of manufacturing the semiconductor device.

2. Description of the Background Art

In power electronics for driving a motor or the like, an IGBT (Insulated Gate Bipolar Transistor) has mainly been used as a switching element based on a characteristic in a region in which a rated voltage is 300 V or more.

FIG. 27 is a sectional view showing a structure of a conventional trench gate type IGBT (TIGBT). As shown in FIG. 27, an $N^+$ buffer layer 32 is formed on a $P^+$ substrate 31 and an $N^-$ layer 33 is formed on the $N^+$ buffer layer 32.

A P base region 35 is selectively formed on the $N^-$ buffer layer 33, and furthermore, an $N^+$ emitter region 36 is selectively formed in a surface of the P base region 35. The P base region 35 can be formed by diffusing a P-type impurity and the $N^+$ emitter region 36 can be formed by diffusing an N-type impurity having a high concentration.

A trench 37 is formed to reach the upper layer portion of the $N^-$ layer 33 adjacently to the $N^+$ emitter region 36 through the P base region 35, and a gate electrode 39 is buried in the trench 37 through a gate insulating film 38 formed on an internal wall of the trench 37. The gate electrode 39 is formed of polysilicon.

A region of the P base region 35 opposed to the gate electrode 39 through the gate insulating film 38 is defined as a channel region. An interlayer insulating film 40 is formed over a large part of a surface of the $N^+$ emitter region 36 and the gate insulating film 38, an emitter electrode 42 is formed over a part of the surface of the $N^+$ emitter region 36 (a portion excluding the large part) and a surface of the P base region 35, and a collector electrode 43 is formed on a back face of the $P^+$ substrate 31.

FIG. 28 is a sectional view showing a structure of a carrier stored TIGBT (CSTBT; Carrier Stored Trench-gate Bipolar Transistor devised by the inventors. As shown in FIG. 28, the TIGBT is different from the TIGBT shown in FIG. 27 in that an N layer 34 is formed between the $N^-$ layer 33 and the P base region 35. The N layer 34 is provided for storing a carrier in a region which is shallower than a bottom portion of the trench 37.

Next, the operation of the IGBTs (TIGBT and CSTBT) shown in FIGS. 27 and 28 will be described.

In the structures shown in FIGS. 27 and 28, when a predetermined collector voltage VCE is set between the emitter electrode 42 and the collector electrode 43 and a predetermined gate voltage VGE to bring an ON state is applied between the emitter electrode 42 and the gate electrode 39, a channel region in the P base region 35 is inverted to have an N type so that a channel is formed.

An electron is injected from the emitter electrode 42 into the $N^-$ layer 33 (N layer 34) through the channel. By the electron thus injected, a forward bias is applied between the $P^+$ substrate 31 and the $N^-$ layer 33 ($N^+$ buffer layer 32), a hole is injected from the $P^+$ substrate 31, a resistance value of the $N^-$ layer 33 is considerably reduced and a current capacity of the IGBT is enhanced. Thus, the IGBT can reduce the resistance value of the $N^-$ layer 33 by the injection of the hole from the $P^+$ substrate 31.

Next, an operation of the IGBT from an ON state to an OFF state will be described. In the structures shown in FIGS. 27 and 28, the gate voltage VGE applied in the ON state between the emitter electrode 42 and the gate electrode 39 is changed into an OFF state such that "0" or a backward bias is applied.

Consequently, the channel region inverted to the N type is returned to the P type so that the injection of the electron from the emitter region 42 is also stopped. By the stop of the injection of the electron, the injection of the hole from the $P^+$ substrate 31 is also stopped. Then, the electron and the hole which are stored in the $N^-$ layer 33 ($N^+$ buffer layer 32) go through the collector electrode 43 and the emitter electrode 42 respectively or are recombined with each other and are annihilated.

In the case of the TIGBT shown in FIG. 27, a MOS structure of the surface is reduced to approximately 1/10 as compared with a plane gate type IGBT. Therefore, a characteristic can be enhanced. Moreover, a current flows to an N region interposed between the P base regions of the adjacent cells over the surface in the plane gate type IGBT. In this region, a voltage drop is great.

However, the gate electrode 39 is formed in a direction of a depth through the P base region 35 in the TIGBT. Consequently, the $N^-$ layer 33 interposed between the P base regions 35 is not present in a current path. Therefore, an operation characteristic can be enhanced.

In the CSTBT shown in FIG. 28, the N layer 34 is formed under the P base region 35. Therefore, the hole sent from the $P^+$ substrate 31 can be prevented from reaching the emitter electrode 42. Consequently, the hole is stored under the P base region 35 and an ON-state voltage can be more reduced than that in the TIGBT.

An IGBT having a trench gate structure shrinks to 1/10 or more as compared with the plane gate type so that the number of gates is increased. Therefore, there is a problem in that a gate capacity is increased. In order to solve the problem, there has been a method of increasing a cell size to reduce the number of gates. If this method is employed, however, the ON-state voltage is raised in the TIGBT and the ON-state voltage is less raised and a breakdown voltage is dropped in the CSTBT. Therefore, the problem cannot be solved practically.

FIG. 29 is a graph showing a relationship between a trench space between the adjacent trenches (a distance between the trenches and a distance between opposed trench ends) and an ON-state voltage in each of the TIGBT and CSTBT. FIG. 30 is a graph showing a relationship between the trench space and a breakdown voltage in each of the TIGBT and the CSTBT. In FIGS. 29 and 30, a curve LT indicates the characteristic of the TIGBT and a curve LC indicates the characteristic of the CSTBT.

Conventionally, the trench space in each of the TIGBT and the CSTBT has been designed to 3 μm. In FIGS. 29 and 30, the trench space is equal to or less than approximately 11 μm. If the trench space is 11 μm, a cell size is increased to three times as large as that in the conventional art and a gate capacity is reduced to 1/3.

In FIG. 29, the ON-state voltage is not greatly changed even if the trench space is increased in the CSTBT as shown in the curve LC, while the ON-state voltage is raised to such a level as not to be negligible with an increase in the trench space in the TIGBT as shown in the curve LT.

In FIG. 30, the breakdown voltage of the TIGBT is less dropped even if the trench space is increased as shown in the curve LT, while the breakdown voltage is rapidly dropped with an increase in the trench space in the CSTBT as shown in the curve LC, and particularly, approximates to 0 V if the trench space exceeds 5 μm.

In the conventional TIGBT and CSTBT, thus, the ON-state voltage is raised or the breakdown voltage is dropped. Therefore, there is a problem in that the trench space to reduce the gate capacity cannot be increased.

In common to the IGBTs (TIGBT and CSTBT), moreover, there is a problem in that a parasitic bipolar transistor (BIP-Tr) formed by the N⁻ layer 33 (the N layer 34 in the CSTBT shown in FIG. 28), the P base region 35 and the N⁺ emitter region 36 is present.

When the parasitic BIP-Tr is operated, the IGBT cannot be controlled and is broken down. Since the CSTBT forms the N layer 34, a resistance value in the vicinity of the P base region 35 is greater than that in the TIGBT and the parasitic BIP-Tr is operated more easily than that in the TIGBT.

Moreover, Japanese Patent Application Laid-Open No. 9-331063 (1997) has proposed some structures to solve the problems of the TIGBT.

FIG. 31 is a sectional view showing a first improved structure of the TIGBT. As shown in FIG. 31, an N⁺ buffer layer 102, an N⁻ layer 101 and a P base region 104 are formed on a P⁺ substrate 103, an N⁺ emitter region 105 is selectively formed on a surface of the P base region 104, and a gate trench 70 is formed from a surface of the N⁺ emitter region 105 to the N⁻ layer 101 through the N⁺ emitter region 105 and the P base region 104. The gate trench 70 includes a gate insulating film 107 and a gate electrode 108 which are formed in a gate trench 107A.

The gate electrode 108 has side and upper surfaces covered with an insulating film 118, a silicate glass film 119 is further formed on the gate electrode 108 through the insulating film 118, and a CVD oxide film 120 is formed on a part of the silicate glass film 119.

Moreover, an emitter trench 80 is formed between the gate trenches 70 and 70 to reach the N⁻ layer 101 through the P base region 104 from the surface of the P base region 104 on which the N⁺ emitter region 105 is not formed. The emitter trench 80 includes an emitter insulating film 80b and an emitter trench electrode 80c which are formed in an emitter trench 80a.

An emitter electrode 110 is formed on a part of the N⁺ emitter region 105 and the P base region 104 so as to be electrically connected to a part of the emitter trench electrode 80c through a contact hole 50 formed in the silicate glass film 119, and a collector electrode 111 is formed on a back face of the P⁺ substrate 103.

Such a first improved structure is different from the TIGBT shown in FIG. 27 in that the emitter trench 80 is provided between the gate trenches 70 and 70. With this structure, a gate capacity can be equal to that of the TIGBT shown in FIG. 27 by setting a trench space between the gate trenches 70 and 70 functioning as gate electrodes to be almost equal to that of the TIGBT shown in FIG. 27.

With the first improved structure, the emitter trench 80 is further formed between the gate trenches 70 and 70. Therefore, a trench space dx (a residual width of silicon) between the gate trench 70 and the emitter trench 80 which are adjacent to each other is 0.2 μm. Thus, there has been disclosed a technique which is very hard to implement in the current manufacturing technology.

FIG. 32 is a sectional view showing a second improved structure of the TIGBT. As shown in FIG. 32, a plurality of emitter trenches 80 are formed between the gate trenches 70 and 70. The emitter trench 80 has the emitter trench electrode 80c formed in the emitter insulating film 80b.

A silicate glass film 110A is formed over the whole surface of a P base region 104 between the emitter trenches 80 and 80. An emitter electrode 110 is formed over the whole surface and is directly formed on a part of an N⁺ emitter layer 105, the P base region 104 adjacent to the gate trench 70 and the emitter trench electrode 80c. Other structures are the same as those of the first improved structure shown in FIG. 31.

In the second improved structure, the emitter trenches 80 are provided between the gate trenches 70 and 70 so that a trench space between the gate trenches 70 and 70 can be increased. Consequently, a gate capacity can be increased.

However, a hole injected from the collector electrode 111 to the P⁺ substrate 103 reaches the P base region 104 electrically connected to the emitter electrode 110, that is, the emitter electrode 110 through only the P base region 104 adjacent to the gate trench 70.

For this reason, a collector saturation voltage VCE (sat) is not simply raised differently from the structure of the TIGBT in FIG. 27 in which the P base region 35 is expanded over almost the whole surface but the hole can be stored in the P base region 104 which is not electrically connected to the emitter electrode 110, that is, a portion provided under the P base region 104 between the emitter trenches 80 and 80. Consequently, the ON-state voltage can be reduced.

The presence of the P base region 104 which is not electrically connected to the emitter electrode 110 has the following problems. In an OFF process of the IGBT, the hole is to reach the emitter electrode 110. However, a large part of the P base region 104 is not electrically connected to the emitter electrode 110. Therefore, the hole cannot sufficiently reach the emitter electrode 110. Thus, there is a problem in that an OFF operation of the IGBT is adversely influenced. In the OFF process, moreover, the hole reaching the emitter electrode 110 passes through the P base region 104 which is electrically connected to the emitter electrode 110. Therefore, there is a problem in that the parasitic BIP-Tr can be operated more easily than in the TIGBT shown in FIG. 27.

SUMMARY OF THE INVENTION

A first aspect of the present invention is directed to a semiconductor device comprising a first semiconductor layer of a first conductivity type having first and second major surface, a second semiconductor layer of a second conductivity type formed on the first major surface of the first semiconductor layer, a third semiconductor layer of the second conductivity type formed on the second semiconductor layer, a fourth semiconductor layer of the first conductivity type formed on the third semiconductor layer, a first trench and at least one second trench arranged to penetrate through at least the fourth semiconductor layer from a surface of the fourth semiconductor layer, a first semiconductor region of the second conductivity type selectively formed in the surface of the fourth semiconductor layer adjacently to the first trench, a first insulating film formed on an internal wall of the first trench, a control electrode buried in the first trench through the first insulating film, the control electrode being not formed in the at least one second trench, a first main electrode electrically connected to at least a part of the first semiconductor region and formed over an almost whole surface of the fourth semiconductor layer, and a second main electrode formed on the second major surface of the first semiconductor layer.

A second aspect of the present invention is directed to the semiconductor device according to the first aspect of the present invention, wherein a distance between the first trench and the at least one second trench is set to 5 μm or less.

A third aspect of the present invention is directed to the semiconductor device according to the first aspect of the present invention, wherein the first trench includes a trench formed in a predetermined direction seen on a plane, the at least one second trench includes a trench formed in the predetermined direction seen on a plane, the first semiconductor region includes a first partial region formed in the vicinity of the first trench and a second partial region extended from the first partial region in such a direction as to go away from the first trench, and the first main electrode is directly formed on the second partial region to carry out electrical connection to the first semiconductor region.

A fourth aspect of the present invention is directed to the semiconductor device according to the third aspect of the present invention, wherein the first semiconductor region includes a third partial region which is further extended from the second partial region and is formed in the vicinity of the at least one second trench, and the first main electrode is further formed directly on the third partial region to carry out electrical connection to the first semiconductor region.

A fifth aspect of the present invention is directed to the semiconductor device according to the fourth aspect of the present invention, wherein the second and third partial regions include a plurality of second and third partial regions respectively, and the plurality of third partial regions are selectively formed in the vicinity of the at least one second trench.

A sixth aspect of the present invention is directed to the semiconductor device according to any of the first to fifth aspects of the present invention, further comprising a second semiconductor region of the first conductivity type formed in the surface of the fourth semiconductor layer adjacently to the at least one second trench, the second semiconductor region having a concentration of an impurity of the first conductivity type set to be higher than that of the fourth semiconductor layer.

A seventh aspect of the present invention is directed to the semiconductor device according to the sixth aspect of the present invention, wherein the concentration of the impurity of the first conductivity type in the second semiconductor region is set to be higher than a concentration of an impurity of the second conductivity type in the first semiconductor region.

An eighth aspect of the present invention is directed to the semiconductor device according to any of the first to seventh aspects of the present invention, wherein the at least one second trench includes a plurality of second trenches.

A ninth aspect of the present invention is directed to the semiconductor device according to any of the first to seventh aspects of the present invention, wherein the first trench and the at least one second trench have equal formation depths.

A tenth aspect of the present invention is directed to the semiconductor device according to any of the first to seventh aspects of the present invention, wherein the first trench and the at least one second trench have equal formation widths.

An eleventh aspect of the present invention is directed to the semiconductor device according to any of the first to seventh aspects of the present invention, further comprising a second insulating film formed on an internal wall of the at least one second trench.

A twelfth aspect of the present invention is directed to the semiconductor device according to the eleventh aspect of the present invention, further comprising is a conductive region buried in the at least one second trench through the second insulating film.

A thirteenth aspect of the present invention is directed to the semiconductor device according to the twelfth aspect of the present invention, wherein the first main electrode is directly formed on the conductive region.

A fourteenth aspect of the present invention is directed to the semiconductor device according to any of the first to thirteenth aspects of the present invention, further comprising a sixth semiconductor layer of the second conductivity type formed between the first semiconductor layer and the second semiconductor layer, the sixth semiconductor layer having a concentration of an impurity of the second conductivity type set to be higher than that of the second semiconductor layer.

A fifteenth aspect of the present invention is directed to a method of manufacturing a semiconductor device, comprising the steps of (a) preparing a substrate including a first semiconductor layer of a first conductivity type having first and second major surfaces and a second semiconductor layer of a second conductivity type formed on the first main surface of the first semiconductor layer, (b) forming a third semiconductor layer of the second conductivity type on the second semiconductor layer, (c) forming a fourth semiconductor layer of the first conductivity type on the third semiconductor layer, (d) selectively forming a first semiconductor region of the second conductivity type in a surface of the fourth semiconductor layer, (e) selectively forming a first trench to penetrate through at least the first semiconductor region and the fourth semiconductor layer from the surface of the fourth semiconductor layer, (f) forming a first insulating film on an internal wall of the first trench, (g) burying a control electrode in the first trench through the first insulating film, (h) forming at least one second trench adjacently to and apart from the first trench to penetrate through at least the fourth semiconductor layer from the surface of the fourth semiconductor layer, (i) forming a first main electrode electrically connected to at least a part of the first semiconductor region over an almost whole surface of the fourth semiconductor layer, and (j) forming a second main electrode on the second major surface of the first semiconductor layer.

A sixteenth aspect of the present invention is directed to the method of manufacturing a semiconductor device according to the fifteenth aspect of the present invention, wherein the steps (e) and (h) are executed such that a distance between the first trench and the at least one second trench is set to 5 μm or less.

A seventeenth aspect of the present invention is directed to the method of manufacturing a semiconductor device according to the fifteenth aspect of the present invention, wherein the step (e) includes the step of forming the first trench in a predetermined direction seen on a plane, the step (h) includes the step of forming the at least one second trench in the predetermined direction seen on a plane, after the steps (d) and (e) are executed, the first semiconductor region includes a first partial region formed in the vicinity of the first trench and a second partial region extended from the first partial region in such a direction as to go away from the first trench, and the step (i) includes the step of directly forming the first main electrode on the second partial region.

An eighteenth aspect of the present invention is directed to the method of manufacturing a semiconductor device according to the fifteenth or sixteenth aspect of the present invention, further comprising the step of (k) forming a second semiconductor region of the first conductivity type in the surface of the fourth semiconductor layer, the second semiconductor region having a concentration of an impurity of the first conductivity type set to be higher than the fourth semiconductor layer.

A nineteenth aspect of the present invention is directed to the method of manufacturing a semiconductor device according to any of the fifteenth to eighteenth aspects of the present invention, wherein the step (e) and the step (h) are executed simultaneously.

A twentieth aspect of the present invention is directed to the method of manufacturing a semiconductor device according to any of the fifteenth to eighteenth aspects of the present invention, further comprising the step of (l) forming a second insulating film <14>on an internal wall of the at least one second trench, the step (f) and the step (l) being executed simultaneously.

A twenty-first aspect of the present invention is directed to the method of manufacturing a semiconductor device according to the twentieth aspect of the present invention, further comprising the step of (m) burying a conductive region in the at least one second trench through the second insulating film, the step (g) and the step (m) being executed simultaneously.

A twenty-second aspect of the present invention is directed to the method of manufacturing a semiconductor device according to any of the fifteenth to twenty-first aspects of the present invention, the step (a) including the steps of (a-1) preparing the first semiconductor layer, and (a-2) forming the second semiconductor layer over the first main surface of the first semiconductor layer by epitaxial growth.

A twenty-third aspect of the present invention is directed to the method of manufacturing a semiconductor device according to any of the fifteenth to twenty-first aspects of the present invention, the step (a) including the steps of (a-1) preparing the second semiconductor layer, and (a-2) implanting an impurity of the first conductivity type from a back face of the second semiconductor layer, thereby forming the first semiconductor layer in a lower layer portion of the second semiconductor layer.

As described above, according to the first aspect of the present invention, the first trench having the control electrode provided therein and at least one second trench having no control electrode provided therein are formed together. Therefore, it is possible to reduce a capacity attended with the control electrode.

In this case, the distance between the first trench and at least one second trench is set such that a sufficient breakdown voltage can be maintained. Consequently, it is also possible to sufficiently prevent a reduction in the breakdown voltage. In addition, it is also possible to sufficiently prevent an ON-state voltage from being raised by the presence of the third semiconductor layer.

Furthermore, the first main electrode is formed over the almost whole surface of the fourth semiconductor layer. Therefore, a carrier can be caused to well flow between the fourth semiconductor layer and the first main electrode so that an operation characteristic can be enhanced.

As a result, the semiconductor device according to the first aspect of the present invention can minimize an increase in the capacity attended with the control electrode without adversely influencing the operation characteristic including the ON-state voltage, the breakdown voltage and the like.

According to the second aspect of the present invention, the distance between the first trench and at least one second trench is set to 5 $\mu$m or less. Consequently, a sufficient breakdown voltage can be maintained.

According to the third aspect of the present invention, the first main electrode is directly formed on the second partial region to carry out the electrical connection to the first semiconductor region. Therefore, it is possible to effectively prevent a parasitic bipolar transistor comprising the first semiconductor region, the fourth semiconductor layer and the third semiconductor layer from being operated.

According to the fourth aspect of the present invention, the first main electrode is further formed directly on the third partial region to carry out the electrical connection. Consequently, it is possible to more reduce a contact resistance of the first main electrode and the first semiconductor region.

According to the fifth aspect of the present invention, a plurality of third partial regions are selectively formed in the vicinity of at least one second trench. Therefore, it is possible to balance the prevention of the operation of the parasitic bipolar transistor with the reduction in the contact resistance.

According to the sixth aspect of the present invention, the contact resistance between the fourth semiconductor layer and the first main electrode can be reduced by the second semiconductor region having the higher concentration of the impurity of the first conductivity type than that of the fourth semiconductor layer. Therefore, it is possible to suppress the operation of the parasitic bipolar transistor.

According to the seventh aspect of the present invention, the concentration of the impurity of the first conductivity type in the second semiconductor region is set to be higher than the concentration of the impurity of the second conductivity type in the first semiconductor region. Therefore, it is possible to suppress the degree of diffusion during the formation of the first semiconductor region. Correspondingly, the device can be microfabricated.

According to the eighth aspect of the present invention, a plurality of second trenches are arranged for one first trench. Therefore, the arrangement is formed repetitively so that the plurality of second trenches can be provided between two first trenches. Thus, it is possible to increase a design margin on the distance between the first trenches.

According to the ninth aspect of the present invention, the first trench and at least one second trench are set to have equal formation depths. Consequently, it is possible to increase a design margin related to the breakdown voltage.

According to the tenth aspect of the present invention, the first trench and at least one second trench are set to have equal formation widths. Consequently, when the first trench and at least one second trench are to be formed simultaneously, they can easily be formed with equal depths.

According to the eleventh aspect of the present invention, the second insulating film is formed on the internal wall of at least one second trench. Therefore, if the first and second insulating films are formed simultaneously, the first and second insulating films can be formed efficiently on the internal walls of the first trench and at least one second trench, respectively.

According to the twelfth aspect of the present invention, the conductive region is further buried in at least one second trench through the second insulating film. Therefore, if the control electrode and the conductive region are simultaneously formed of the same material, the control electrode and the conductive region can be formed efficiently in the first trench and at least one second trench, respectively.

According to the thirteenth aspect of the present invention, the first main electrode is directly formed on the conductive region. Therefore, it is not necessary to consider a margin on the electrode region, the insulating film covering the vicinity thereof and the like. Consequently, it is possible to reduce the distance between the first trench and at least one second trench.

According to the fourteenth aspect of the present invention, the second semiconductor layer can be formed with a small thickness by the presence of the sixth semiconductor layer having the higher concentration of the impurity of the second conductivity type than that of the second semiconductor layer. Consequently, it is possible to enhance an operation characteristic such as a reduction in an ON-state voltage.

In the semiconductor device manufactured by the method of manufacturing a semiconductor device according to the fifteenth aspect of the present invention, the first trench having the control electrode provided therein and at least one second trench having no control electrode provided therein are formed together. Therefore, it is possible to reduce a capacity attended with the control electrode.

In this case, the steps (e) and (h) are executed such that the distance between the first trench and at least one second trench can maintain a sufficient breakdown voltage. Consequently, it is also possible to sufficiently prevent a reduction in the breakdown voltage. In addition, it is also possible to sufficiently prevent an ON-state voltage from being raised by the presence of the third semiconductor layer formed at the step (c).

At the step (i), furthermore, the first main electrode is formed over the almost whole surface of the fourth semiconductor layer. Therefore, a carrier can be caused to well flow between the fourth semiconductor layer and the first main electrode so that an operation characteristic can be enhanced.

As a result, in the method of manufacturing a semiconductor device according to the fifteenth aspect of the present invention, it is possible to manufacture a semiconductor device capable of minimizing an increase in the capacity attended with the control electrode without adversely influencing the operation characteristic including the ON-state voltage, the breakdown voltage and the like.

In the semiconductor device manufactured by the method of manufacturing a semiconductor device according to the sixteenth aspect of the present invention, the distance between the first trench and at least one second trench is set to 5 $\mu$m or less. Consequently, a sufficient breakdown voltage can be maintained.

According to the seventeenth aspect of the present invention, at the step (i), the first main electrode is directly formed on the second partial region to carry out the electrical connection of the first main electrode and the first semiconductor region. By the presence of the second partial region of the first semiconductor region, therefore, it is possible to effectively prevent a parasitic bipolar transistor comprising the first semiconductor region, the fourth semiconductor layer and the third semiconductor layer from being operated.

According to the eighteenth aspect of the present invention, at the step (k), the second semiconductor region of the first conductivity type which has the higher concentration of the impurity of the first conductivity type than that of the fourth semiconductor layer is formed in the surface of the fourth semiconductor layer.

Accordingly, it is possible to reduce a contact resistance between the fourth semiconductor layer and the first main electrode by the second semiconductor region. Consequently, it is possible to suppress the operation of the parasitic bipolar transistor.

According to the nineteenth aspect of the present invention, the steps (e) and (h) are executed simultaneously. Consequently, it is possible to efficiently form the first trench and at least one second trench.

According to the twentieth aspect of the present invention, the steps (f) and (l) are executed simultaneously. Consequently, it is possible to efficiently form the first and second insulating films on the internal walls of the first trench and at least one second trench.

According to the twenty-first aspect of the present invention, the steps (g) and (m) are executed simultaneously. Consequently, it is possible to efficiently form the control electrode and the conductive region in the first trench and at least one second trench.

According to the twenty-second aspect of the present invention, at the step (a-2), the second semiconductor layer is formed by the epitaxial growth. Therefore, it is possible to form the second semiconductor layer with good controllability of the concentration of the impurity and a film thickness.

According to the twenty-third aspect of the present invention, at the step (a2), the impurity of the first conductivity type is implanted from the back face of the second semiconductor layer to form the first semiconductor layer. Therefore, it is possible to manufacture the semiconductor device comparatively inexpensively.

In order to solve the above-mentioned problems, it is an object of the present invention to provide a semiconductor device in which an increase in a gate capacity can be minimized without adversely influencing an operation characteristic and a method of manufacturing the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

(Basic Mode)

Figure 1:
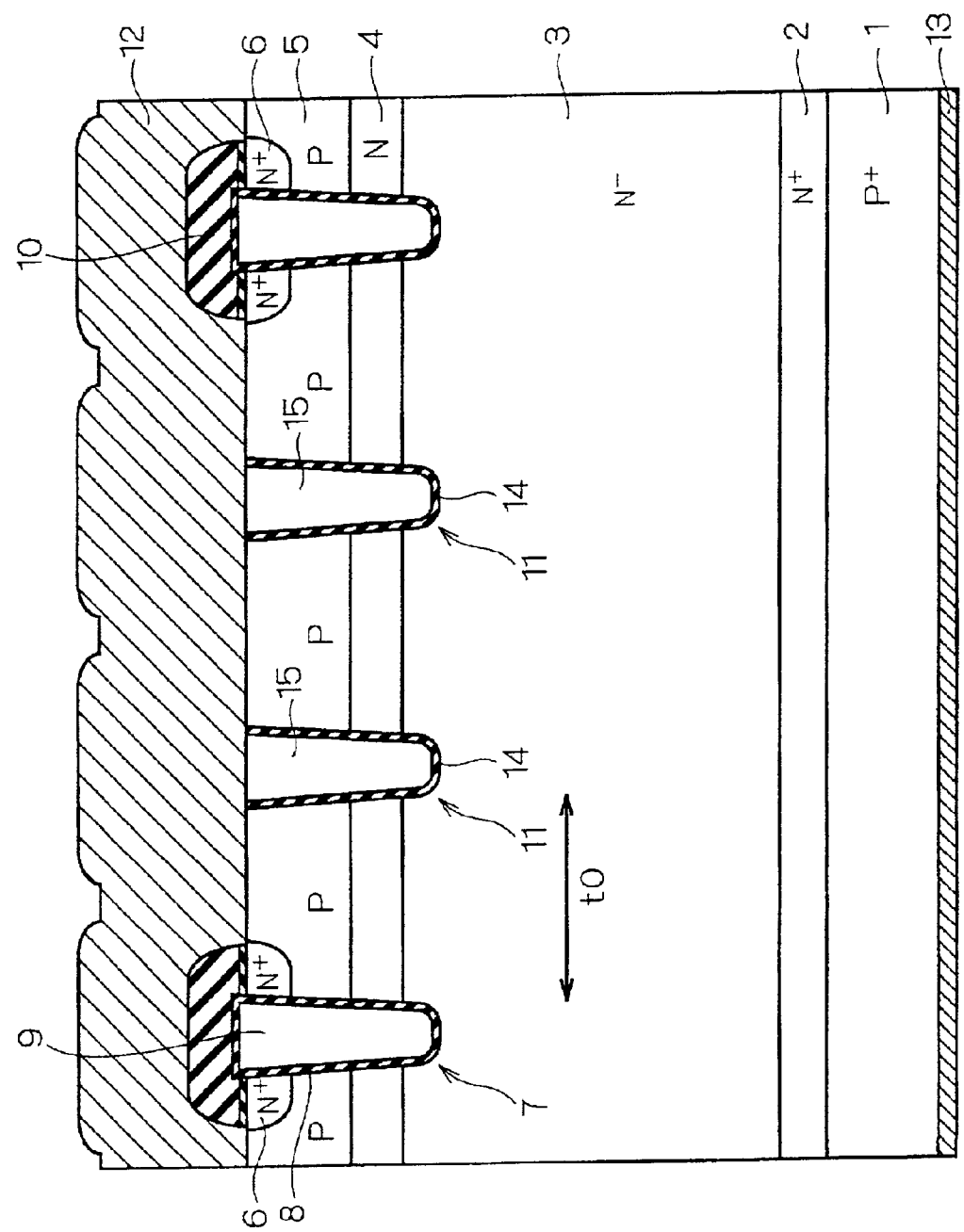
FIG. 1 is a sectional view showing a structure of a CSTBT according to a first embodiment of the present invention.

FIG. 1 is a sectional view showing a structure of a CSTBT according to a first embodiment of the present invention. As shown in FIG. 1, an $N^+$ buffer layer 2 is formed on a $P^+$ substrate 1 and an $N^-$ layer 3 is formed on the N+ buffer layer 2.

A P base layer 5 is selectively formed on the $N^-$ layer 3 through an N layer 4, and furthermore, an $N^+$ emitter region 6 is selectively formed in a surface of the P base layer 5. The P base layer 5 can be formed by diffusing a P-type impurity and the $N^+$ emitter region 6 can be formed by diffusing an N-type impurity having a high concentration.

A first trench 7 is formed to reach the upper layer portion of the $N^-$ layer 3 adjacently to the $N^+$ emitter region 6 through the P base region 5 and the N layer 4, and a gate electrode 9 is formed in the first trench 7 through a gate insulating film 8. The gate electrode 9 is formed of polysilicon. A region of the P base layer 5 opposed to the gate electrode 9 through the gate insulating film 8 is defined as a channel region.

A predetermined number of (two in FIG. 1) second trenches 11 are formed between the first trenches 7 and 7. The second trench 11 is formed to reach the upper layer portion of the $N^-$ layer 3 through the P base layer 5 and the N layer 4, and a polysilicon region 15 is formed in the second trench 11 through an insulating film 14. The second trench 11 is different from the first trench 7 in that the $N^+$ emitter region 6 is not formed in a vicinal region and the gate electrode 9 is not formed on the inside.

A trench space between the first trench 7 and the second trench 11 which are provided adjacently to each other (and apart from each other) is set to be almost equal to the trench space between the trenches 37 and 37 described with reference to FIGS. 27 and 28. More specifically, the trench space is set to such a distance that a breakdown voltage is not dropped.

An interlayer insulating film 10 is formed over a large part of a surface of the $N^+$ emitter region 6 and the gate insulating film 8, an emitter electrode 12 is formed over a part of the surface of the $N^+$ emitter region 6 (a portion excluding the large part) and surfaces of the P base layer 5 and the second trench 11 (the insulating film 14 and the polysilicon region 15), and a collector electrode 13 is formed on a back face of the $P^+$ substrate 1.

More specifically, the collector electrode 13 is directly formed on the almost whole surface of the P base layer 5. The almost whole surface of the P base layer 5 includes the surface of the P base layer 5 between the first trench 7 and the second trench 11, and furthermore, a surface of the first trench 7 between the second trenches 11 and 11.

In the first embodiment having such a structure, when a predetermined collector voltage VCE is set between the emitter electrode 12 and the collector electrode 13 and a predetermined gate voltage VGE to bring an ON state is applied between the emitter electrode 12 and the gate electrode 9, a channel region in the P base region 5 is inverted to have an N type so that a channel is formed.

An electron is injected from the emitter electrode 12 into the $N^-$ layer 3 through the channel. By the electron thus injected, a forward bias is applied between the P+substrate 1 and the $N^-$ layer 3 ($N^+$ buffer layer 2), a hole is injected from the $P^+$ substrate 1, a resistance value of the $N^-$ layer 3 is considerably reduced and a current capacity of the IGBT is enhanced. Thus, the IGBT can reduce the resistance value of the $N^-$ layer 3 by the injection of the hole from the $P^+$ substrate 1.

In the first embodiment for the CSTBT, furthermore, the N layer 4 is provided under the P base layer 5 so that the hole sent from the $P^+$ substrate 1 can be prevented from reaching the emitter electrode 12. Consequently, the hole is stored under the P base layer 5 so that an ON-state voltage can be more dropped than that in the TIGBT shown in FIG. 27.

Next, an operation of the IGBT from an ON state to an OFF state will be described. The gate voltage VGE applied in the ON state between the emitter electrode 12 and the gate electrode 9 is changed into the OFF state such that "0" or a backward bias is applied.

Consequently, the channel region inverted to the N type is returned to the P type so that the injection of the electron from the emitter electrode 12 is also stopped. By the stop of the injection of the electron, the injection of the hole from the $P^+$ substrate 1 is also stopped. Then, the electron and the hole which are stored in the $N^-$ layer 3 ($N^+$ buffer layer 2) go through the collector electrode 13 and the emitter electrode 12 respectively or are recombined with each other and are annihilated. Also in the case of the CSTBT, a depletion layer is formed irrespective of the presence of the N layer 4. Therefore, the same OFF characteristic as that in the TIGBT can be obtained.

At this time, the emitter electrode 12 is formed on the almost whole surface of the P base layer 5. Therefore, it is possible to enhance the characteristic of an OFF operation in which the hole can sufficiently be extracted to the emitter electrode 12 during the OFF operation.

Figure 27:
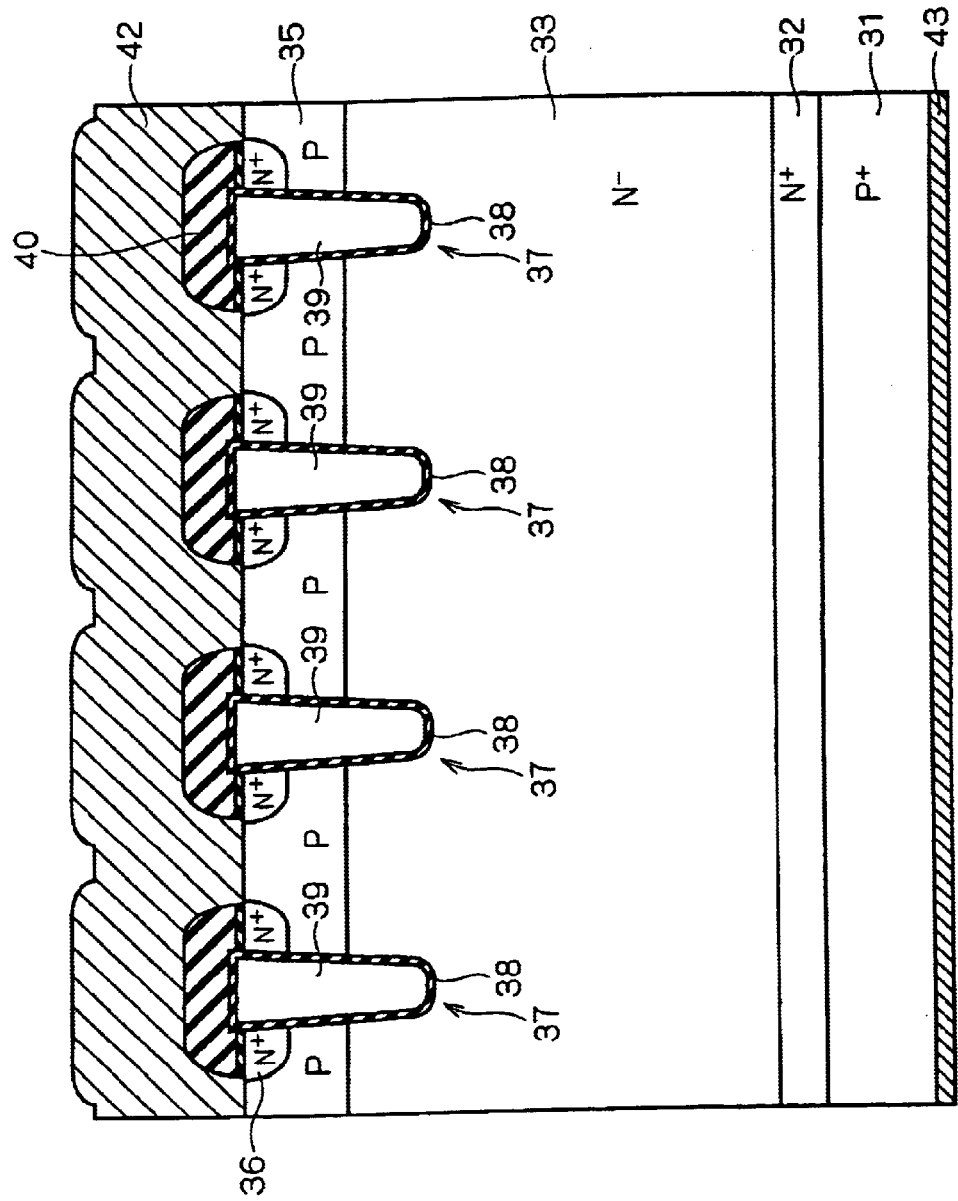
FIG. 27 is a sectional view showing a structure of a conventional TIGBT.
Figure 28:
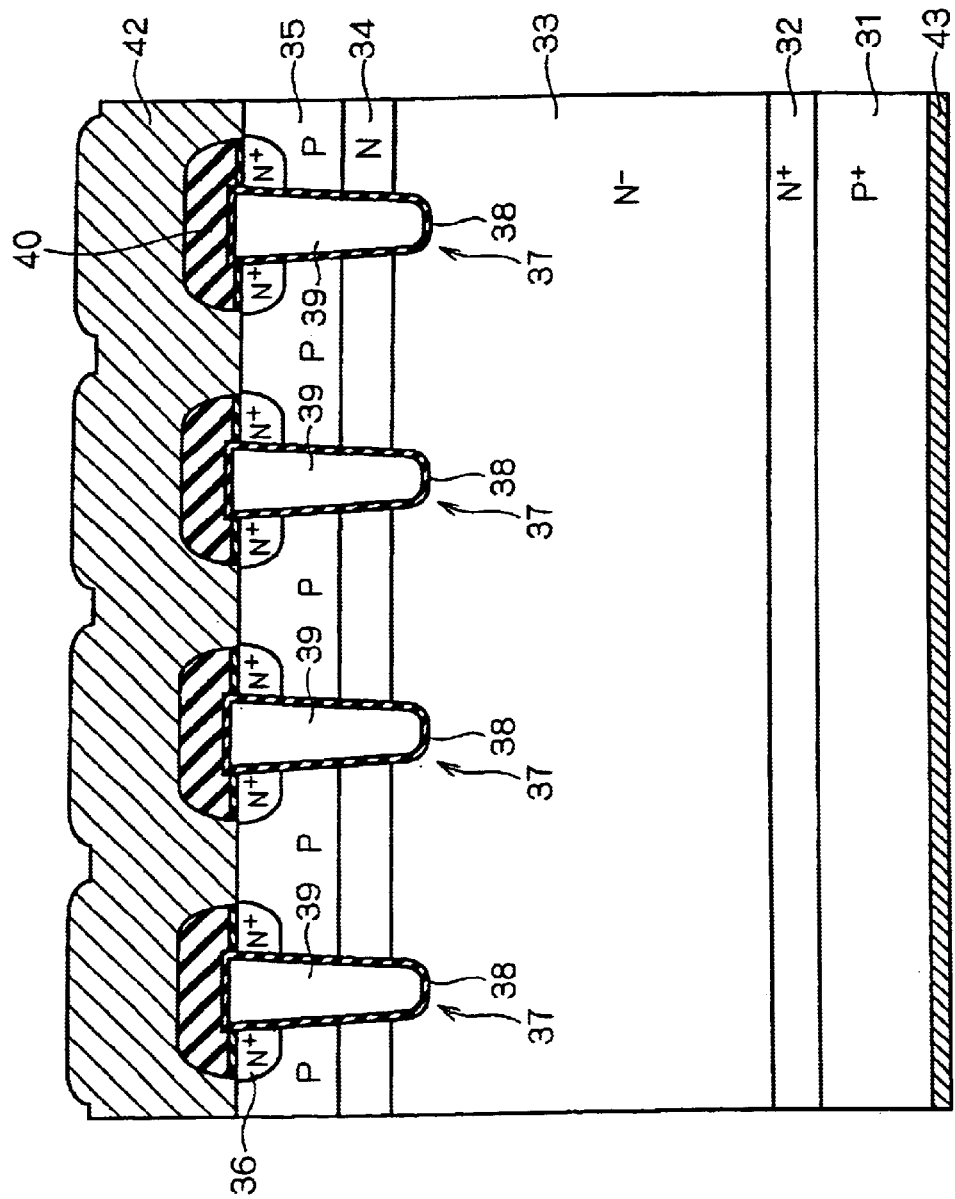
FIG. 28 is a sectional view showing a structure of a conventional CSTBT.

As compared with the conventional TIGBT and CSTBT having the structures shown in FIGS. 27 and 28, one gate electrode 9 is formed for three first trenches 7 (the number of the first trenches 7 and the second trenches 11). Therefore, a switching operation can be carried out more quickly with a gate capacity of ⅓.

Moreover, the second trench 11 is provided between the first trenches 7 and 7. Consequently, a trench space to between the first trench 7 and the second trench 11 which are adjacent to each other is equal to that in the conventional art.

Therefore, there is no possibility that a breakdown voltage might be dropped. In the case of the CSTBT, moreover, even if a trench space between the P base layers 5 (the P base layer 5 formed adjacently to the first trench 7) contributing to an actual operation is enlarged, an ON-state voltage is less raised than that of the TIGBT. With a three-time cell size as in the present embodiment, the ON-state voltage can be more reduced than that of the conventional TIGBT.

Figure 29:
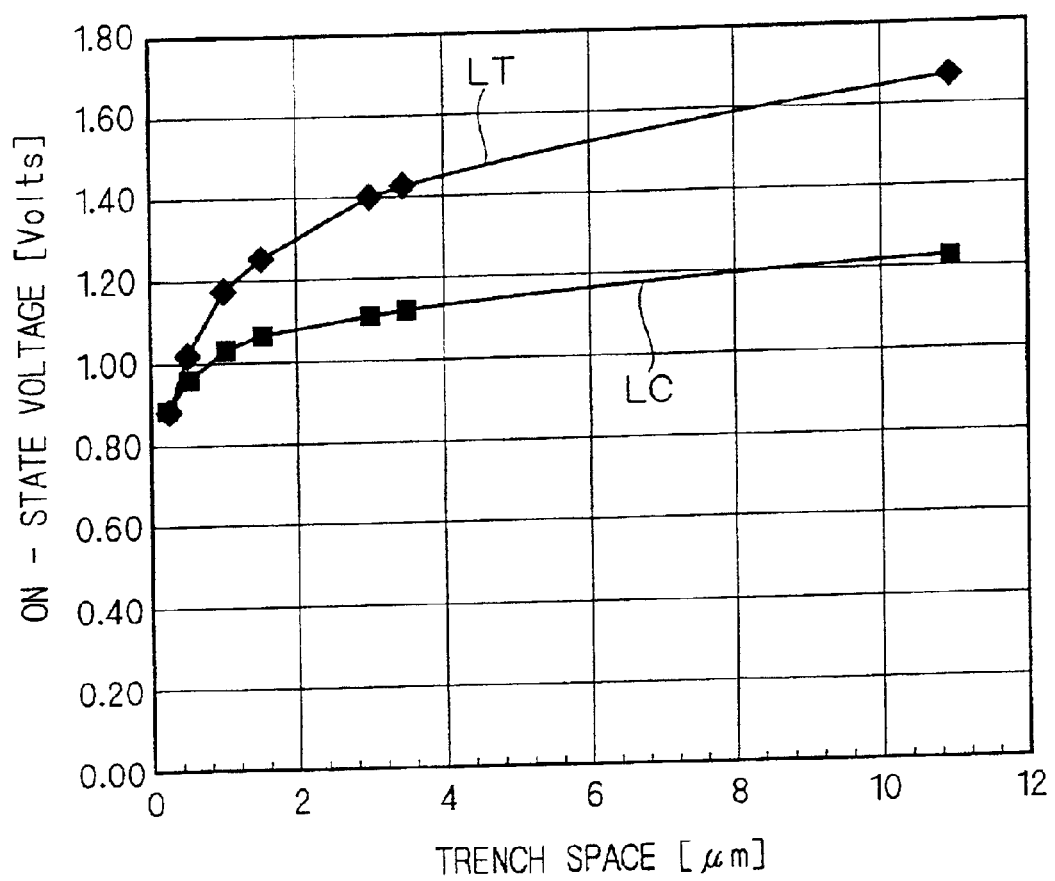
FIG. 29 is a graph showing a relationship between a trench space and an ON state voltage in each of a TIGBT and a CSTBT.
Figure 30:
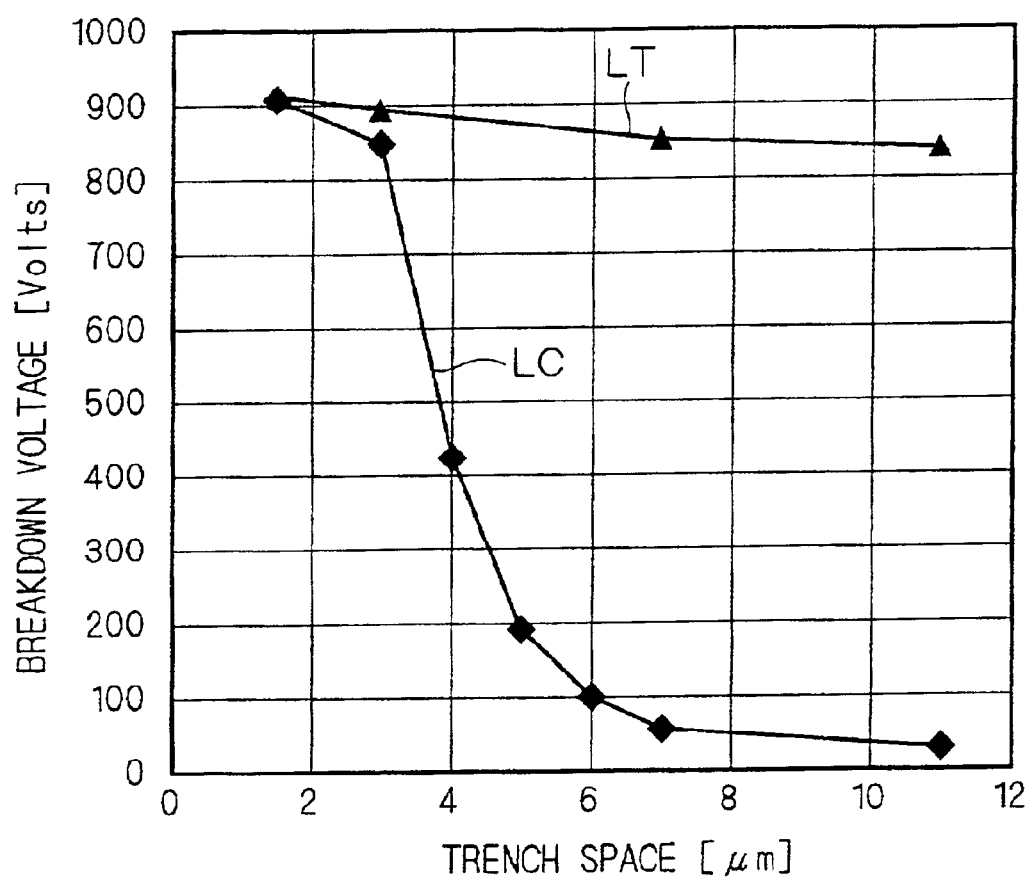
FIG. 30 is a graph showing a relationship between the trench space and a breakdown voltage in each of the TIGBT and the CSTBT.
Figure 31:
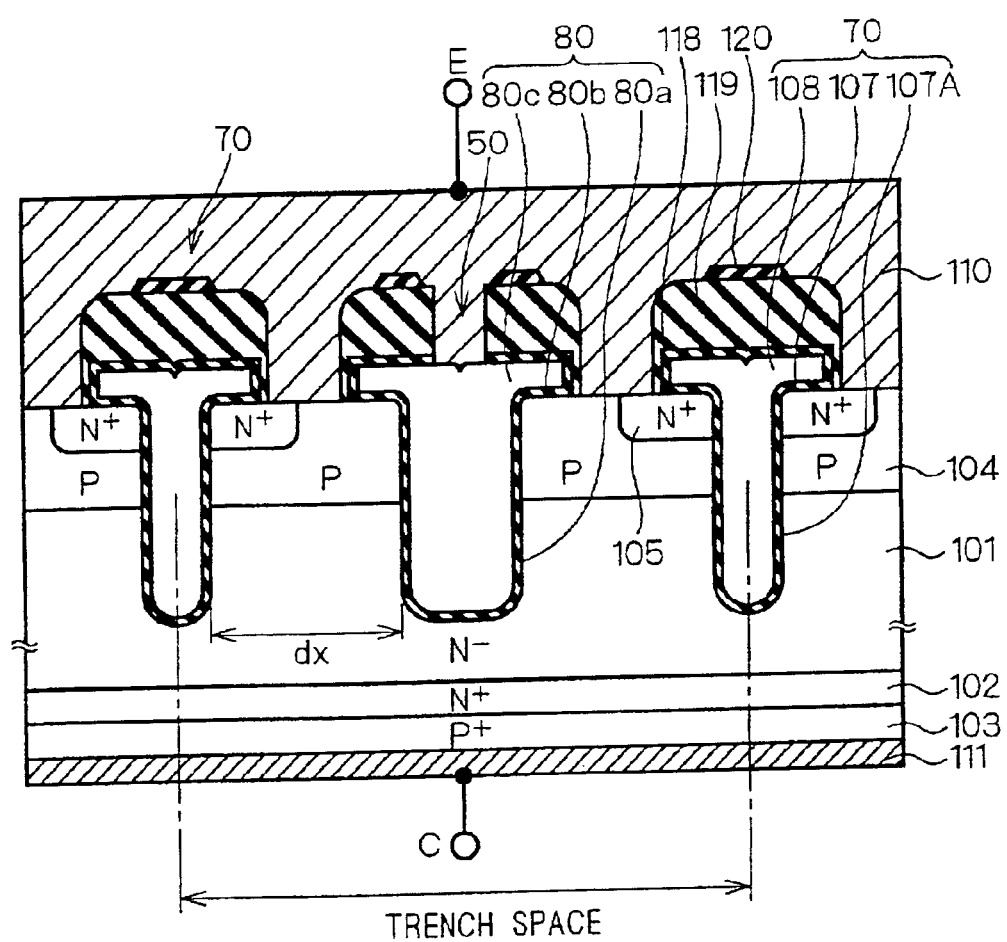
FIG. 31 is a sectional view showing a first improved structure of the TIGBT.
Figure 32:
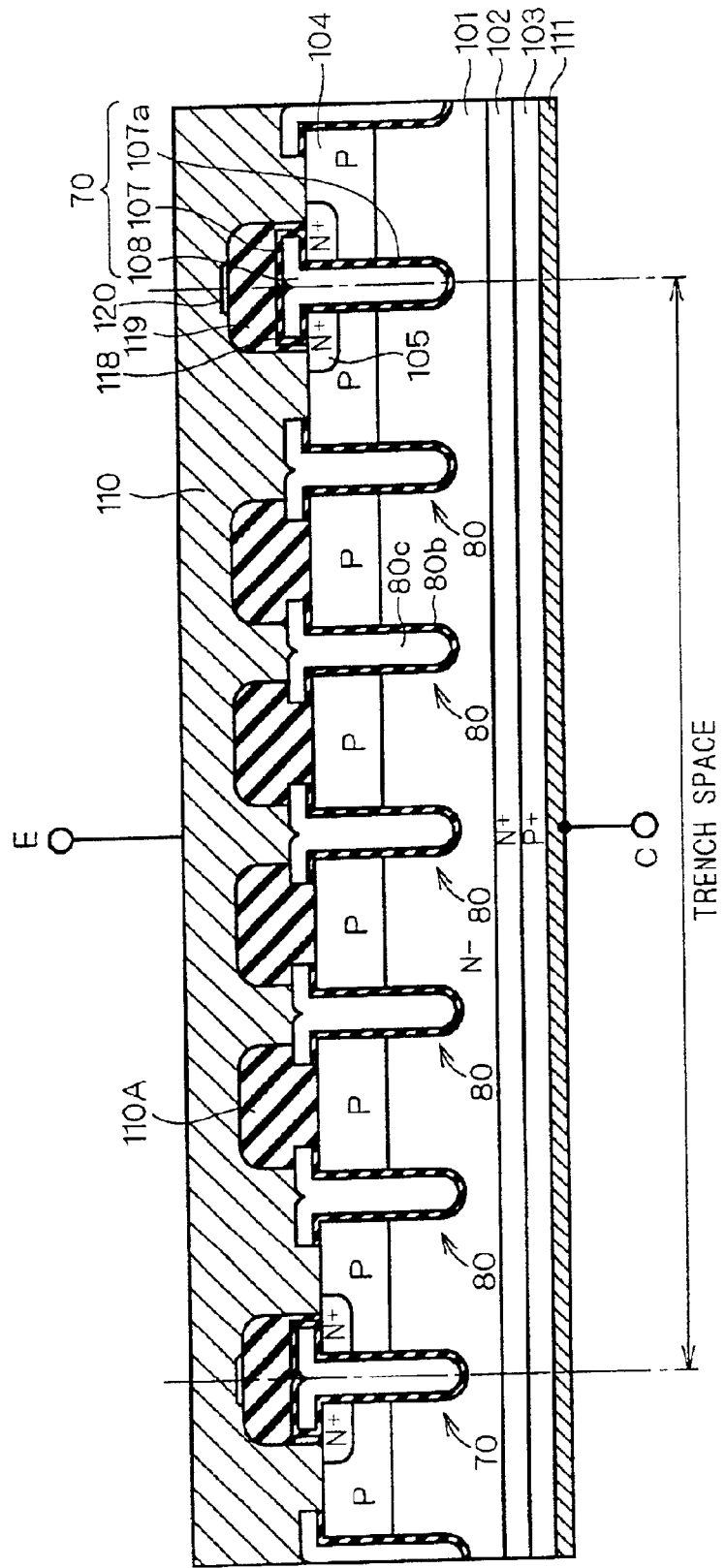
FIG. 32 is a sectional view showing a second improved structure of the TIGBT.

Effects of the CSTBT according to the present embodiment will be considered based on simulation results shown in FIGS. 29 and 30. Referring to FIGS. 29 and 30, the CSTBT is set to have such a structure that a breakdown voltage is not dropped when an N layer is formed to have a cell size of 4 $\mu$m in the conventional TIGBT. Therefore, when the trench space is 3 $\mu$m or more, the breakdown voltage is dropped rapidly.

The trench space is determined by a W/P (wafer process) rule and is desirably set to 5 $\mu$m or less under the present circumstances. In this case, it is possible to obtain a CSTBT having a combination structure of the trench and the N layer 4 which is the most suitable for actual use by regulating the number of the trenches (the first trench 7 and the second trench 11) to be formed and the trench space between the trenches which are adjacent to each other.

By setting formation widths of the first trench 7 and the second trench 11 to be equal to each other, moreover, it is possible to easily cause formation depths of the trenches to be equal to each other during manufacture. If the formation depths of the trenches are greatly different from each other, a breakdown voltage might be determined by a formation space between trenches having greater formation depths, which is not desirable. By setting the formation depths of the first trench 7 and the second trench 11 to be equal to each other, it is possible to increase a design margin related to the breakdown voltage.

Furthermore, the emitter electrode 12 can be directly formed on the second trench 11 (the insulating film 14 and the polysilicon region 15) without formation of an interlayer insulating film. Therefore, it is not necessary to take a margin with the interlayer insulating film into consideration. Correspondingly, it is possible to reduce the trench space between the first trench 7 and the second trench 11.

(Another Mode)

Figure 2:
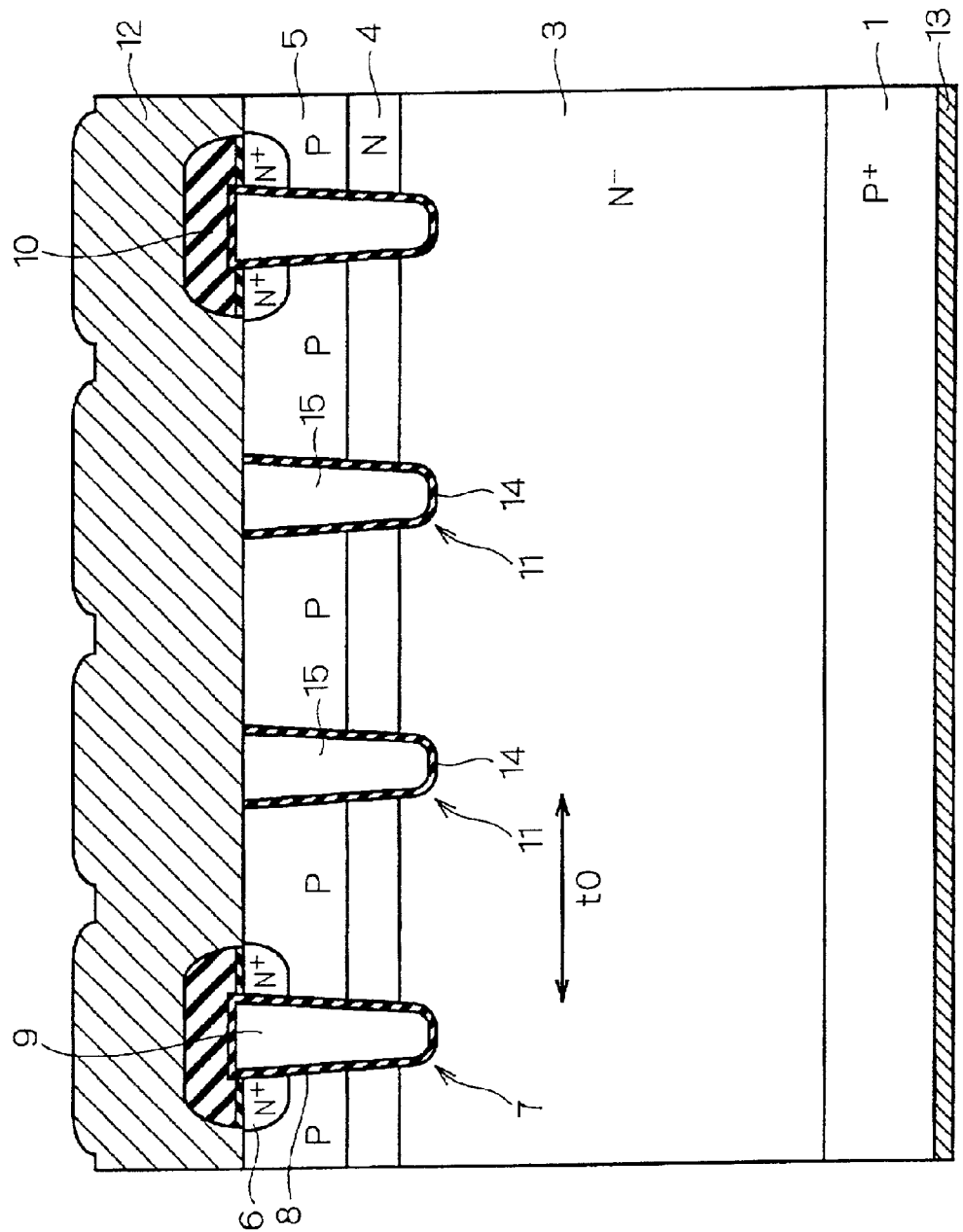
FIG. 2 is a sectional view showing another mode of the CSTBT according to the first embodiment.

FIG. 2 is a sectional view showing another mode of the CSTBT according to the first embodiment. As shown in FIG. 2, the N$^+$ layer 2 is omitted so that a thickness of the N$^-$ layer 3 is increased. In this mode, the CSTBT can be manufactured by using the N$^-$ layer 3 as a manufacture starting layer so that a manufacturing cost can be reduced, which will be described below in detail.

<Second Embodiment>

(First Mode)

Figure 3:
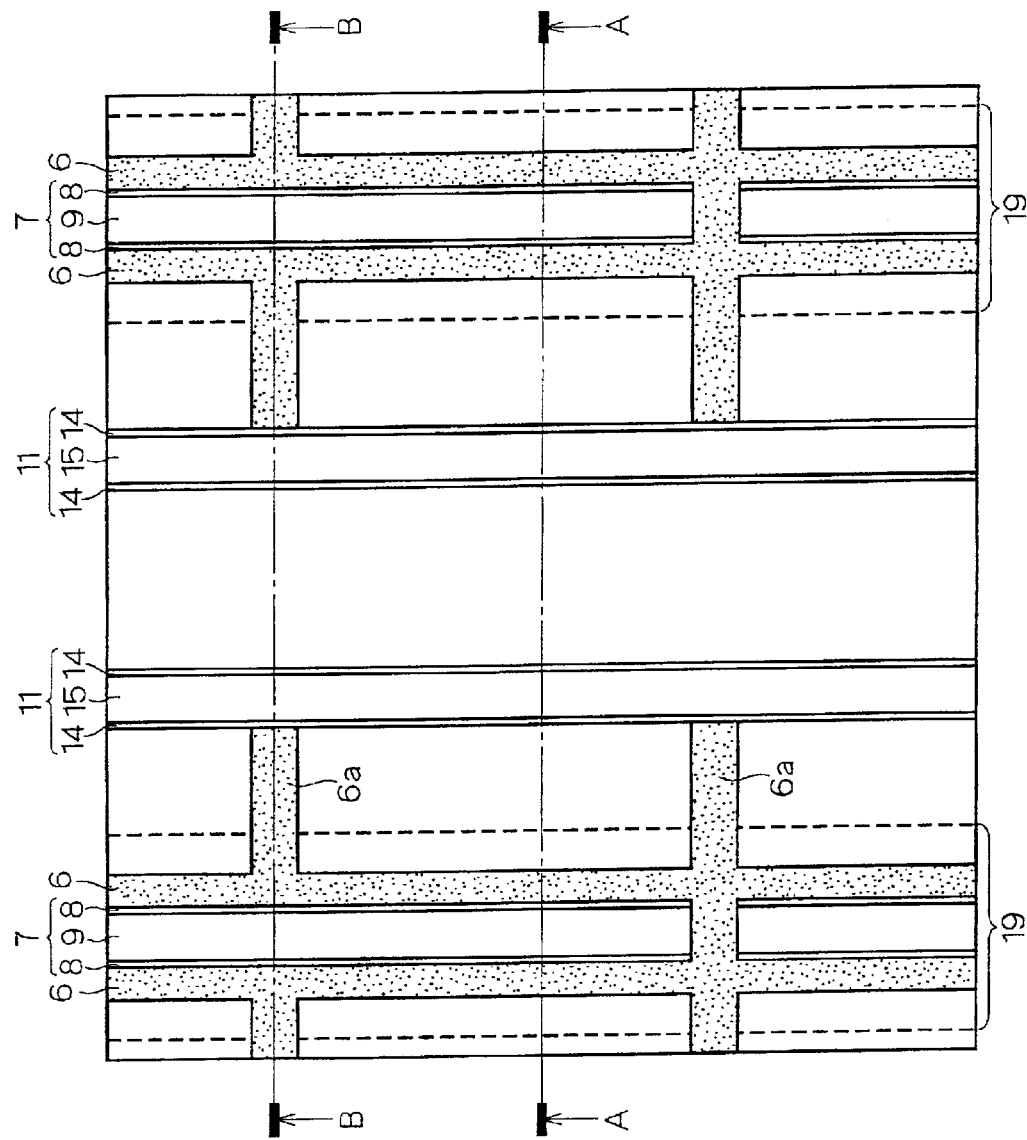
FIG. 3 is a plan view showing a first mode of a CSTBT according to a second embodiment.
Figure 4:
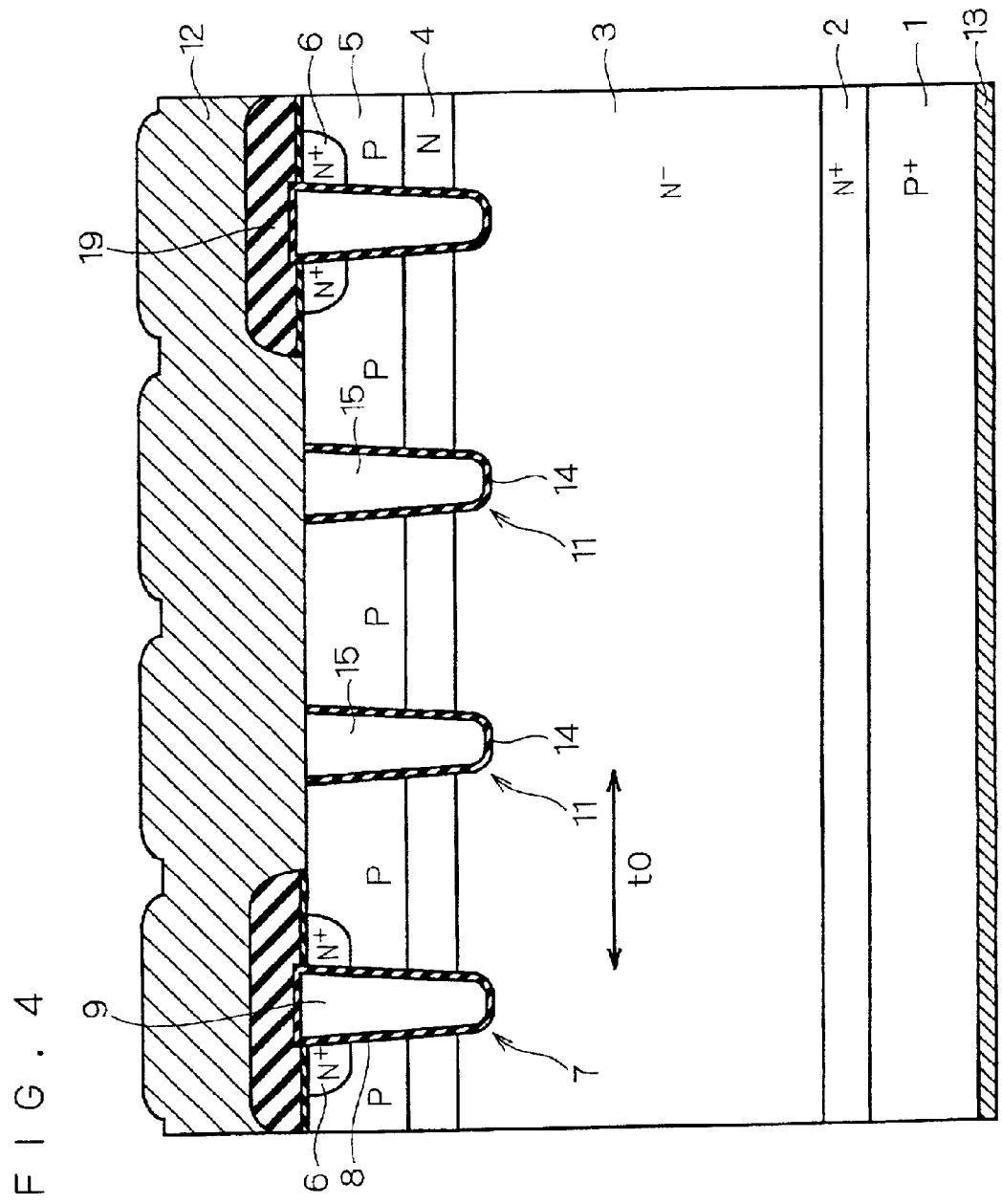
FIG. 4 is a sectional view showing an A—A section in FIG. 3.

FIG. 3 is a plan view showing a first mode of a CSTBT according to a second embodiment of the present invention. FIG. 4 is a sectional view showing an A—A section in FIG. 3 and FIG. 5 is a sectional view showing a B—B section in FIG. 3.

As shown in FIG. 3, a first trench 7 (a gate insulating film 8 and a gate electrode 9) is extended in a longitudinal direction (as seen on a plane). Similarly, two second trenches 11 (an insulating film 14 and a polysilicon region 15) are also extended in the longitudinal direction between the first trenches 7 and 7.

An N$^+$ emitter region 6 has a region (a first partial region) to be formed adjacently to the first trench 7 and a plurality of emitter extended regions 6a (second partial regions) extended in a perpendicular direction to the direction of the formation of the first trench 7 toward the second trench 11 provided adjacently to the first trench 7.

Figure 5:
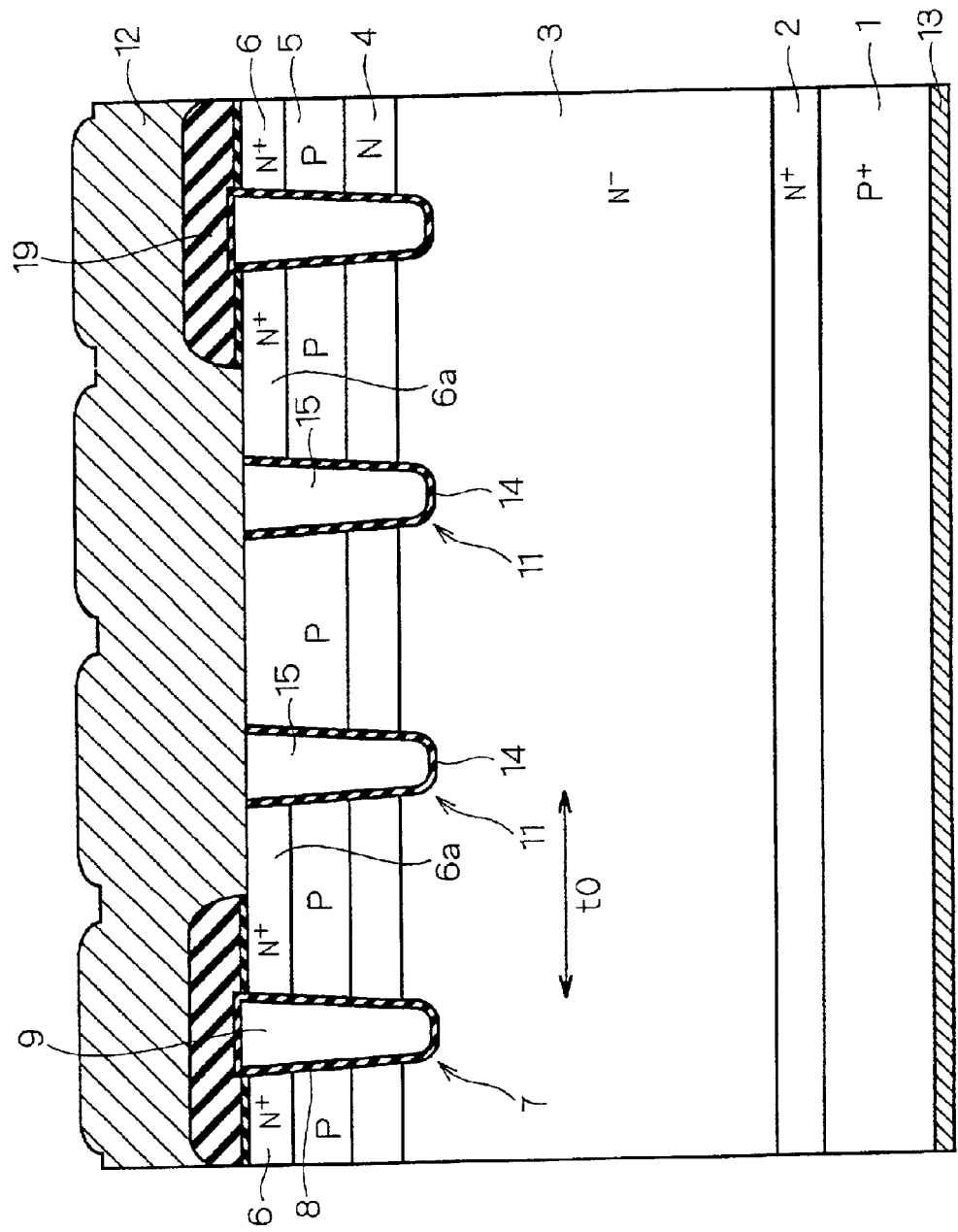
FIG. 5 is a sectional view showing a B—B section in FIG. 3.

As shown in these drawings, the N$^+$ emitter region 6 excluding a part of the emitter extended region 6a is completely covered with an interlayer insulating film 19, and an emitter electrode 12 is directly formed on only a part of the emitter extended region 6a as shown in FIG. 5. Consequently, the N$^+$ emitter region 6 is electrically connected to the emitter electrode 12. Since other structures are the same as the basic structure according to the first embodiment shown in FIG. 1, description will be omitted.

According to the first mode of the second embodiment, a part of the emitter extended region 6a and the emitter electrode 12 come in contact with each other so that the N$^+$ emitter region 6 and the emitter electrode 12 are electrically connected to each other. Therefore, an operation of a parasitic BIP-Tr can be suppressed.

An operation of a CSTBT will be considered. In the case in which an electronic current flows from the emitter electrode 12, an emitter current flows in a direction of a plane along the first trench 7 from a part of the emitter extended region 6a provided in contact with the emitter electrode 12 and then passes through the N$^+$ emitter region 6 in the vicinity of the first trench 7. Consequently, a voltage drop is generated in the N$^+$ emitter region 6 through the emitter current.

The voltage drop in the N$^+$ emitter region 6 becomes greater with an increase in an amount of the current flowing in the N$^+$ emitter region 6. More specifically, a high voltage is generated in a region in the N$^+$ emitter region 6 where a heavy current flows, and controls the current flowing in the N$^+$ emitter region 6. By such a mechanism, the emitter current flowing in the whole CSTBT becomes uniform and the heavy current flows with difficulty so that an ON operation of the parasitic BIP-Tr can be suppressed.

On the other hand, in the basic structure according to the first embodiment shown in FIG. 1, the regions where the gate electrode 9 and the N$^+$ emitter region 6 are to be formed are more reduced than those in the conventional TIGBT and CSTBT shown in FIGS. 27 and 28. Therefore, the above-mentioned mechanism efficiently functions with difficulty and the emitter current easily becomes nonuniform.

As compared with the foregoing, in the first mode of the second embodiment, the emitter electrode 12 is directly formed on a part of the emitter extended region 6a so that an emitter current path can be formed in the direction of the plane. Consequently, the emitter current can easily flow uniformly. As compared with the first embodiment, therefore, the above-mentioned mechanism can be operated efficiently. Therefore, the ON operation of the parasitic BIP-Tr can be suppressed effectively.

(Second Mode)

Figure 6:
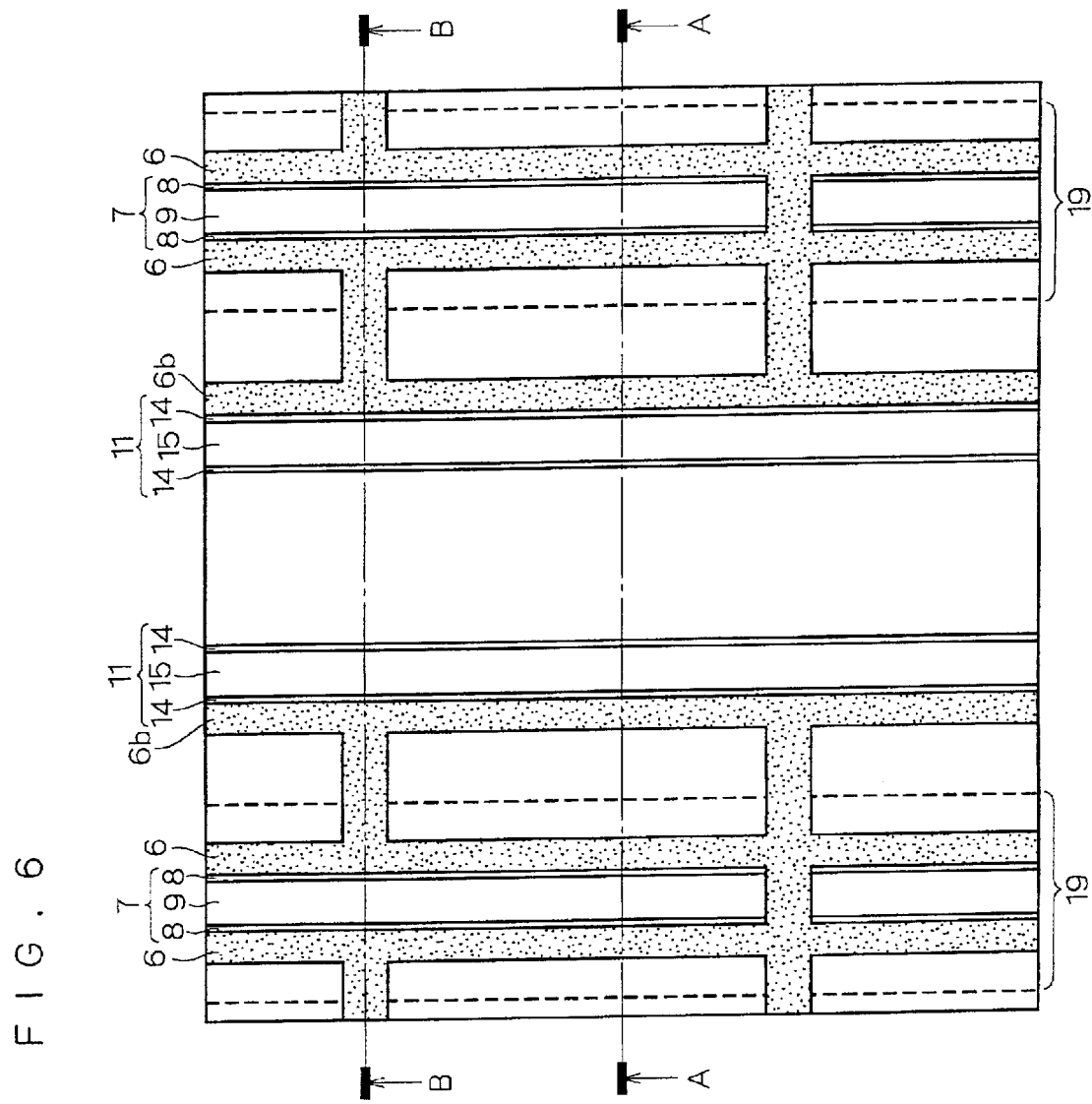
FIG. 6 is a plan view showing a second mode of the CSTBT according to the second embodiment.
Figure 7:
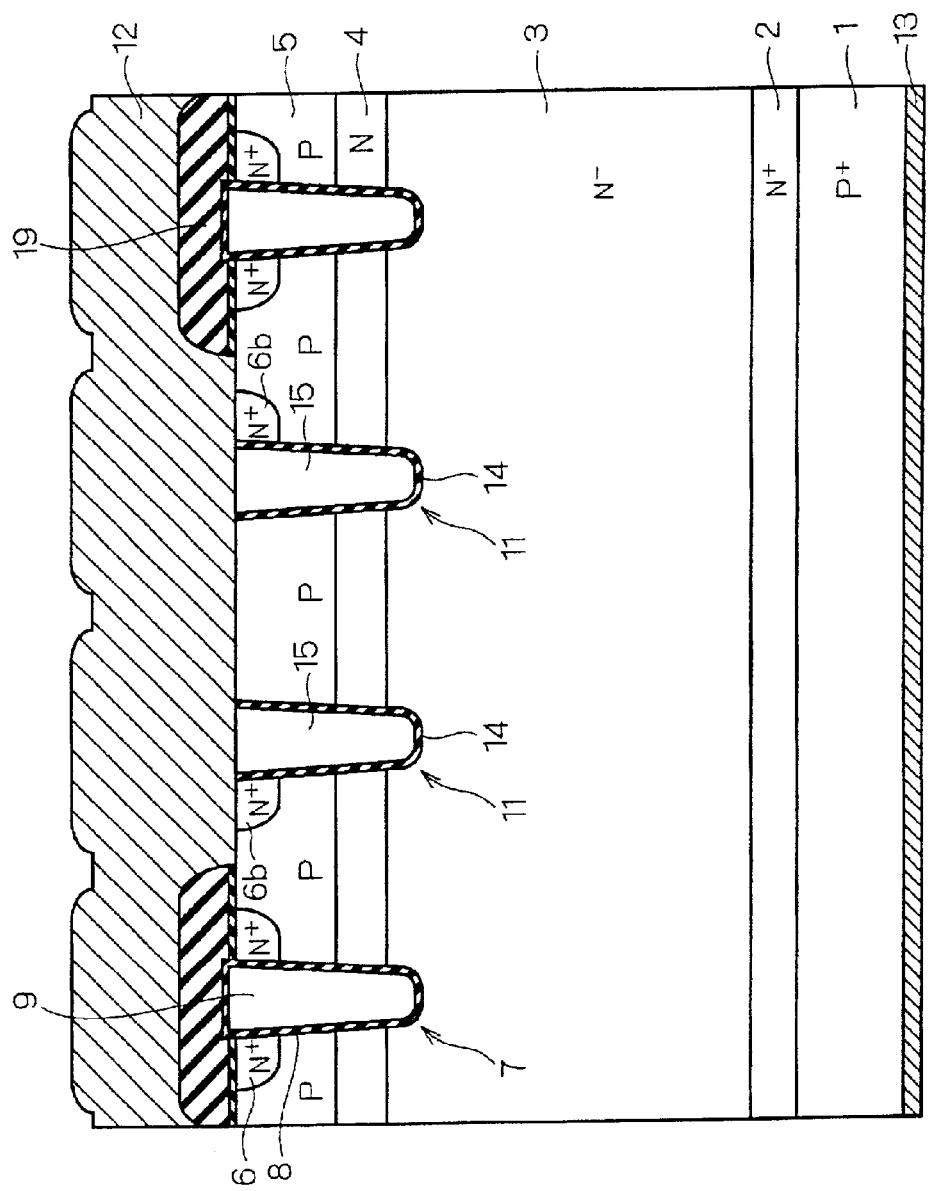
FIG. 7 is a sectional view showing an A—A section in FIG. 6.
Figure 8:
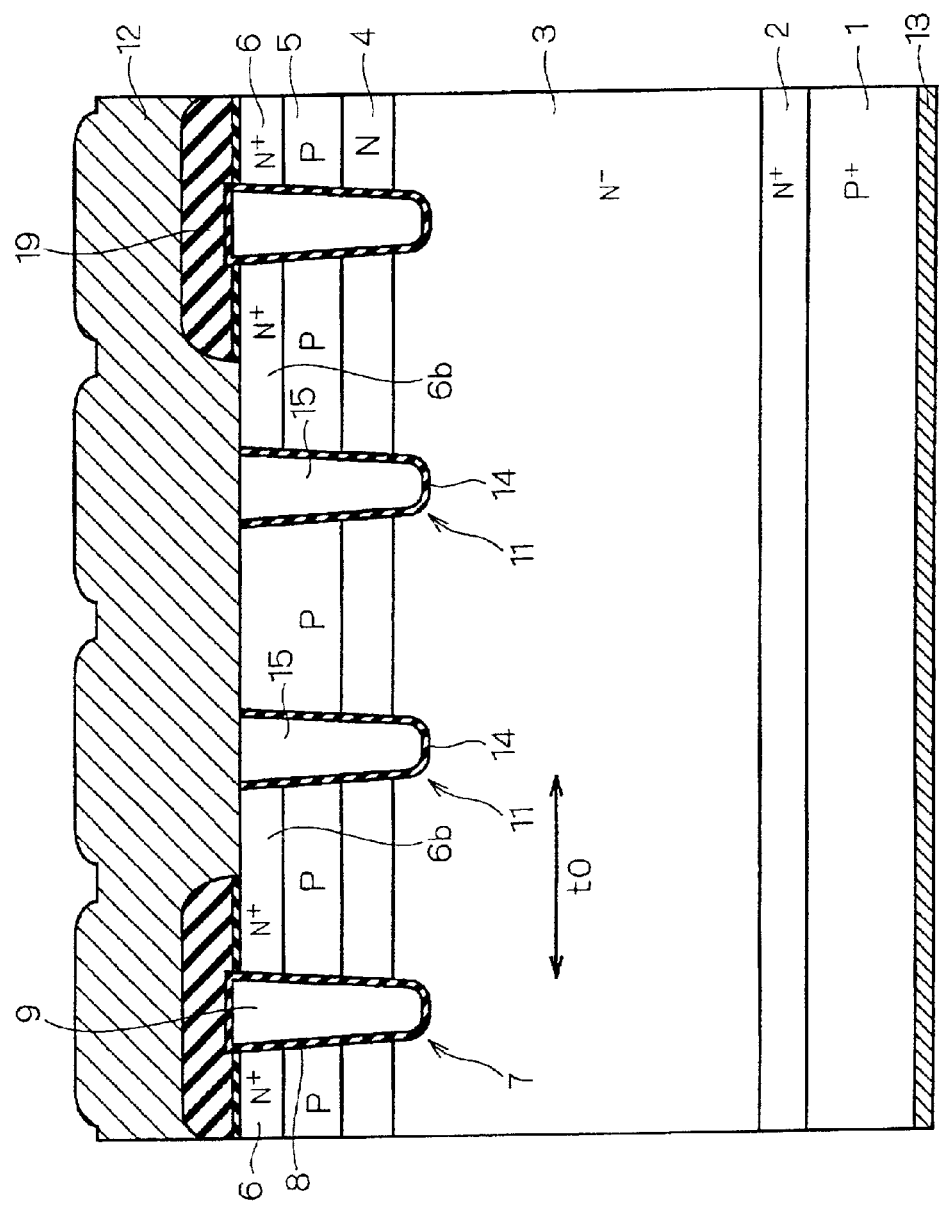
FIG. 8 is a sectional view showing a B—B section in FIG. 6.

FIG. 6 is a plan view showing a second mode of the CSTBT according to the second embodiment of the present invention. FIG. 7 is a sectional view showing an A—A section in FIG. 6. Moreover, FIG. 8 is a sectional view showing a B—B section in FIG. 6.

As shown in FIG. 6, an N$^+$ emitter region 6 has, toward a second trench 11 adjacent thereto, an emitter extended region 6b provided with a region (a second partial region) extended in a perpendicular direction to a direction of formation of the first trench 7 and a region (a third partial region) which is further extended from the second partial region and is formed adjacently to the second trench 11.

As shown in these drawings, an interlayer insulating film 19 is formed to completely cover an N+ emitter region 6 excluding a large part of the emitter extended region 6b. As shown in FIG. 8, an emitter electrode 12 is directly formed on only a large part of the emitter extended region 6b so that the N+ emitter region 6 can be electrically connected to the emitter electrode 12. Since other structures are the same as those in the first mode shown in FIGS. 3 to 5, description will be omitted.

The emitter extended region 6b according to the second mode is different from the emitter extended region 6a according to the first mode in that the third partial region is further formed adjacently to the second trench 11. More specifically, the emitter extended region 6b can have a larger contact area for the electrical connection to the emitter electrode 12 than the emitter extended region 6a.

As a result, it is possible to reduce a contact resistance of the emitter electrode 12 and the N+ emitter region 6. Therefore, it is possible to obtain such an effect that an ON-state voltage can be reduced. Also in the case in which the ON-state voltage is not reduced, a variation in the contact resistance of the emitter electrode 12 and the N+ emitter region 6 can be suppressed. In addition, the mechanism can function more effectively than that in the first embodiment shown in FIG. 1. Therefore, an excellent suppression function for a parasitic BIP-Tr can be obtained.

(Third Mode)

Figure 9:
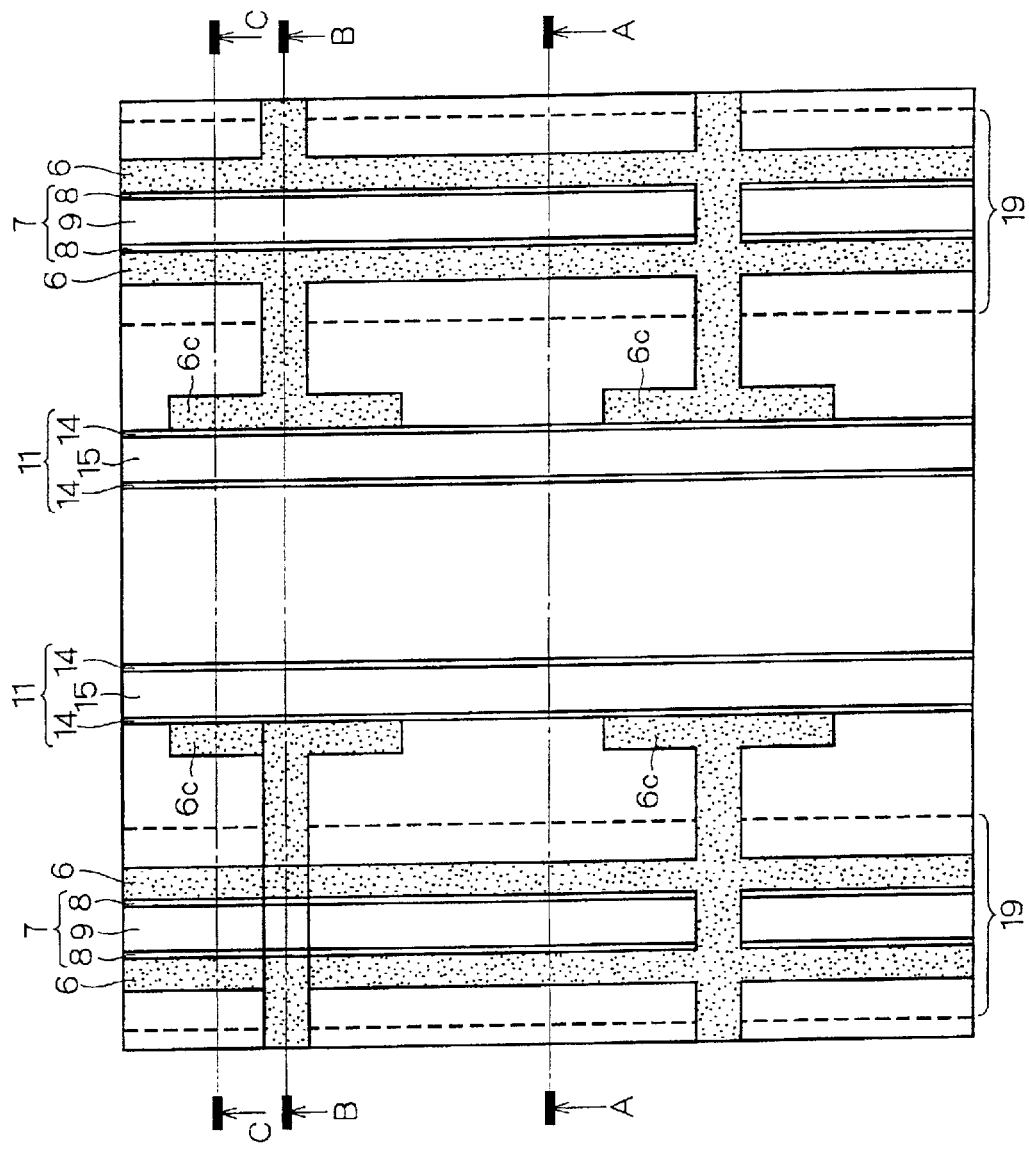
FIG. 9 is a plan view showing a third mode of the CSTBT according to the second embodiment.

FIG. 9 is a plan view showing a third mode of the CSTBT according to the second embodiment of the present invention. An A—A section in FIG. 9 is the same as that in FIG. 4, a B—B section in FIG. 9 is the same as that in FIG. 5 except that the emitter extended region 6a is replaced with an emitter extended region 6c, and a C—C section in FIG. 9 is the same as that in FIG. 7 except that the emitter extended region 6b is replaced with the emitter extended region 6c.

As shown in FIG. 9, an N+ emitter region 6 has, toward a second trench 11 adjacent thereto, a plurality of emitter extended regions 6c provided with a region (a second partial region) extended in a perpendicular direction to a direction of formation of the first trench 7 and a region (a third partial region) which is formed to be partially extended from the second partial region adjacently to the second trench 11.

In the third mode, an interlayer insulating film 19 is formed to completely cover an N+ emitter region 6 excluding a large part of the emitter extended regions 6c and an emitter electrode 12 is directly formed on only the large part of the emitter extended regions 6c. Since other structures are the same as those in the first mode shown in FIGS. 3 to 5, description will be omitted.

The emitter extended region 6c according to the third mode is different from the emitter extended region 6a according to the first mode in that the region (third partial region) is partially formed adjacently to the second trench 11. More specifically, the emitter extended region 6c can have a larger contact area for the electrical connection to the emitter electrode 12 than the emitter extended region 6a. Consequently, it is possible to reduce a contact resistance of the emitter electrode 12 and the N+ emitter region 6.

Moreover, the emitter extended region 6c according to the third mode can more reduce the region (third partial region) provided adjacently to the second trench 11 than the emitter extended region 6b according to the second mode. Consequently, it is possible to increase a contact area for electrical connection of a P base layer 5 and the emitter electrode 12. Correspondingly, a hole can be caused to flow to the emitter electrode 12. Thus, it is possible to obtain such an advantage that a parasitic BIP-Tr can suppress an ON operation.

More specifically, in the third mode, it is possible to balance the suppression of the operation of the parasitic BIP-Tr with the reduction in the contact resistance of the emitter electrode 12 and the N+ emitter region 6.

In consideration of the suppression of the operation of the parasitic BIP-Tr and the reduction in the contact resistance of the emitter electrode 12 and the N+ emitter region 6, the respective structures according to the first to third modes are optimized. Consequently, it is possible to obtain the structure of the N+ emitter region 6 which is optimum for actual use.

<Third Embodiment>

(First Mode)

Figure 10:
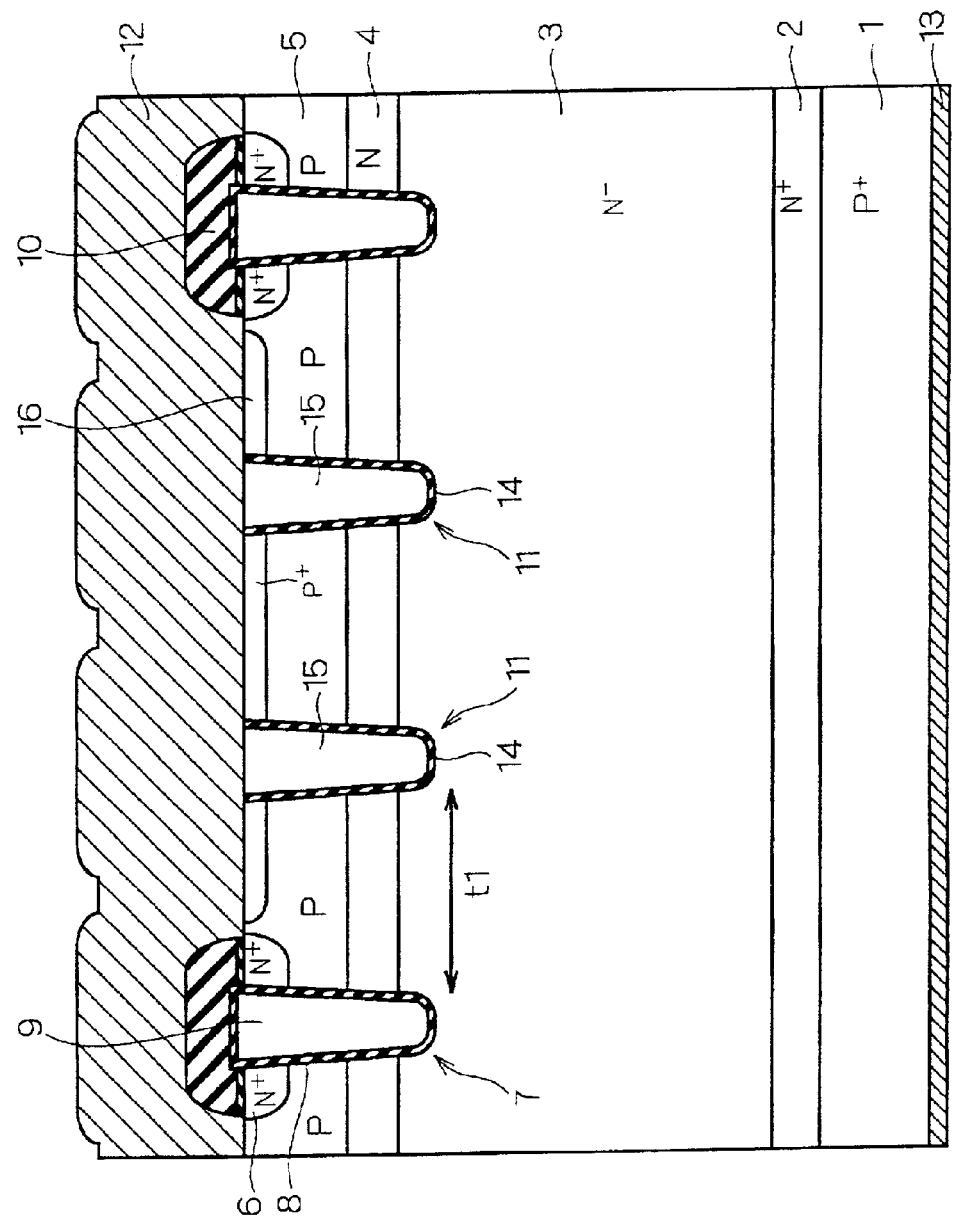
FIG. 10 is a sectional view showing a structure of a first mode of a CSTBT according to a third embodiment.

FIG. 10 is a sectional view showing a structure according to a first mode of a CSTBT according to a third embodiment of the present invention. As shown in FIG. 10, a P+ diffusion region 16 is formed in a surface of a P base layer 5 to be a contact face with an emitter electrode 12. Since other structures are the same as the basic structure according to the first embodiment shown in FIG. 1, description will be omitted.

While a basic operation according to the first mode of the third embodiment is the same as that of the first embodiment, a parasitic BIP-Tr is operated with more difficulty than that in the CSTBT according to the first embodiment in the same manner as in the CSTBT according to the second embodiment.

More specifically, the P+ diffusion region 16 is formed so that a hole injected through a P+ substrate 1 can be caused to flow into the emitter electrode 12 through the P+ diffusion region 16. Consequently, it is possible to reduce a contact resistance between the emitter electrode 12 and the P+ diffusion region 16. Thus, it is possible to suppress the operation of the parasitic BIP-Tr.

(Second Mode)

Figure 11:
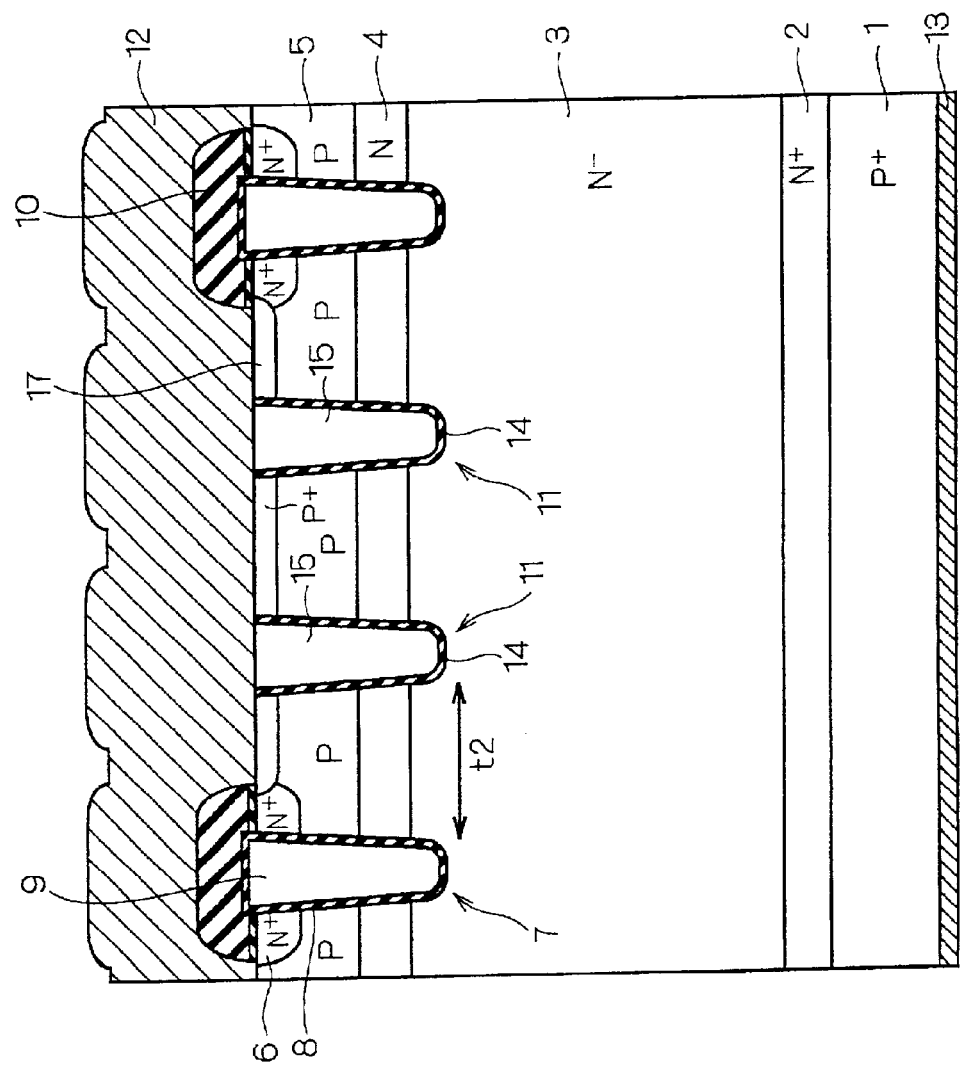
FIG. 11 is a sectional view showing a structure of a second mode according to the third embodiment.

FIG. 11 is a sectional view showing a structure according to a second mode of the third embodiment. As shown in FIG. 11, a P+ diffusion region 17 is formed in a surface of a P base layer 5 to be a contact face with an emitter electrode 12.

A concentration of a P-type impurity in the P+ diffusion region 17 is set to be higher than that of an N-type impurity in an N+ emitter region 6. Consequently, an area in which the N+ emitter region 6 is to be formed can be prevented from being increased by a side diffusion of the N+ emitter region 6. Thus, a device can be microfabricated.

As a result, in the second mode, a trench space between trenches (a first trench 7 and a second trench 11) adjacent to each other can be set to a trench space t2 which is smaller than the trench space t1 according to the first mode, a cell size can be reduced, and furthermore, a design margin can be increased.

<Fourth Embodiment>

FIGS. 12 to 20 are sectional views showing a method of manufacturing a CSTBT according to a fourth embodiment of the present invention. The manufacturing method according to the fourth embodiment comprises the steps of manufacturing a structure equivalent to the structure of the CSTBT shown in FIG. 1.

Figure 12:
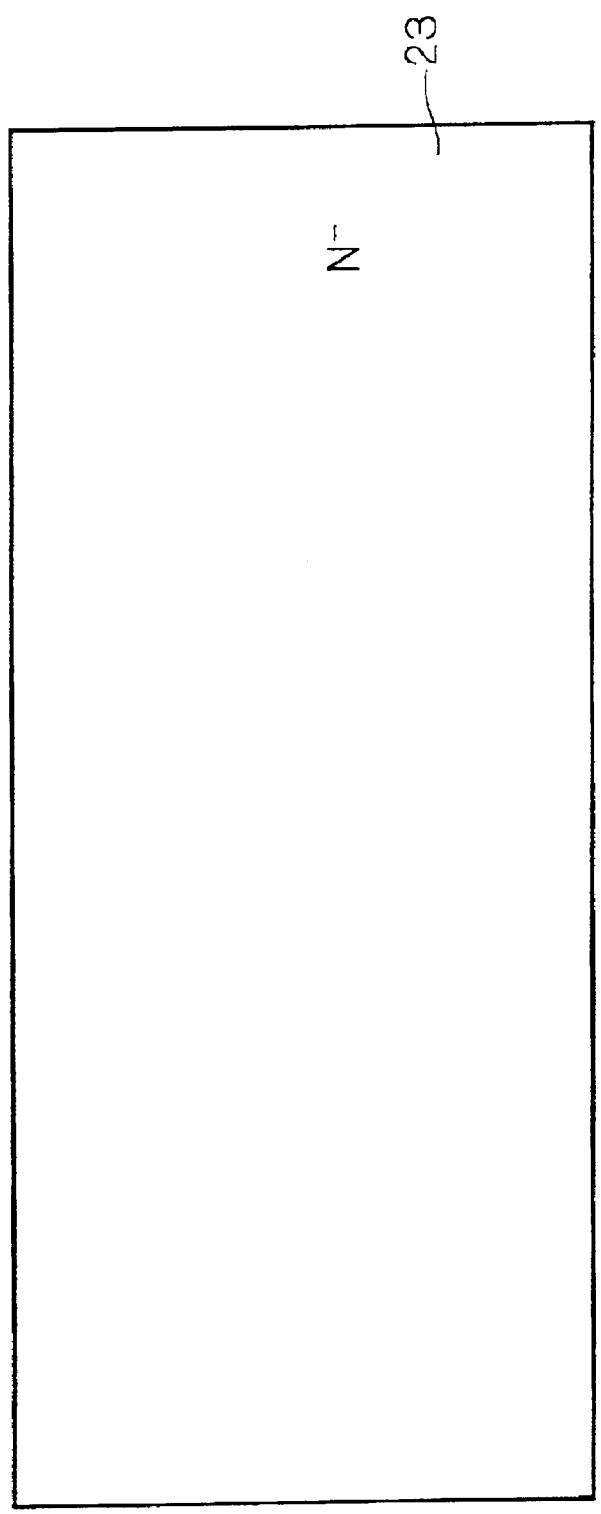
FIGS. 12 to 20 are sectional views showing a method of manufacturing a CSTBT according to a fourth embodiment.

As shown in FIG. 12, first of all, a substrate 23 having an N-type silicon to be an N− layer 3 is prepared. The substrate 23 implies a structure including the P+ substrate 1, the N+ buffer layer 2 and the N− layer 3 shown in FIG. 1. For convenience of description, only a region corresponding to the N⁻ layer 3 is shown.

Figure 13:
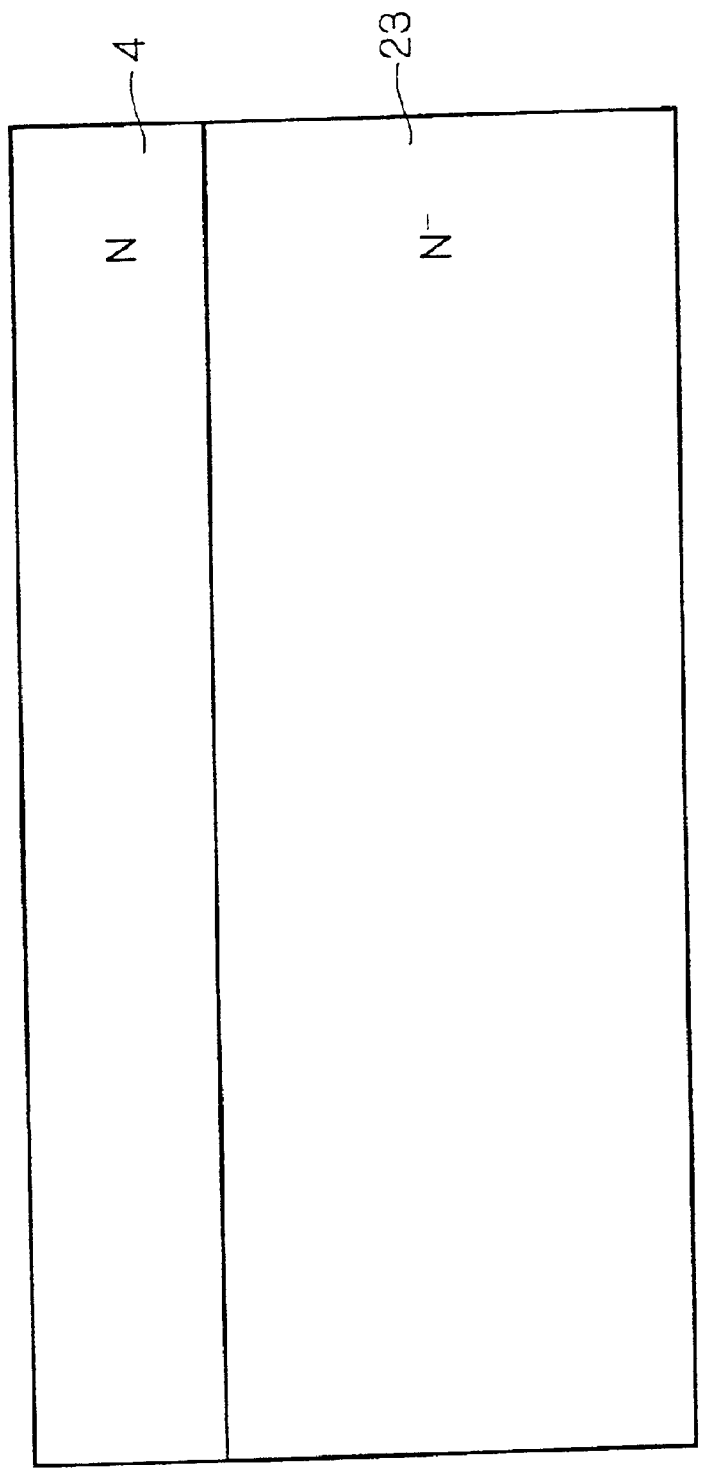

As shown in FIG. 13, next, an N-type impurity is implanted over the whole surface of the substrate 23 and is then diffused to form an N layer 4 on the substrate 23.

Figure 14:
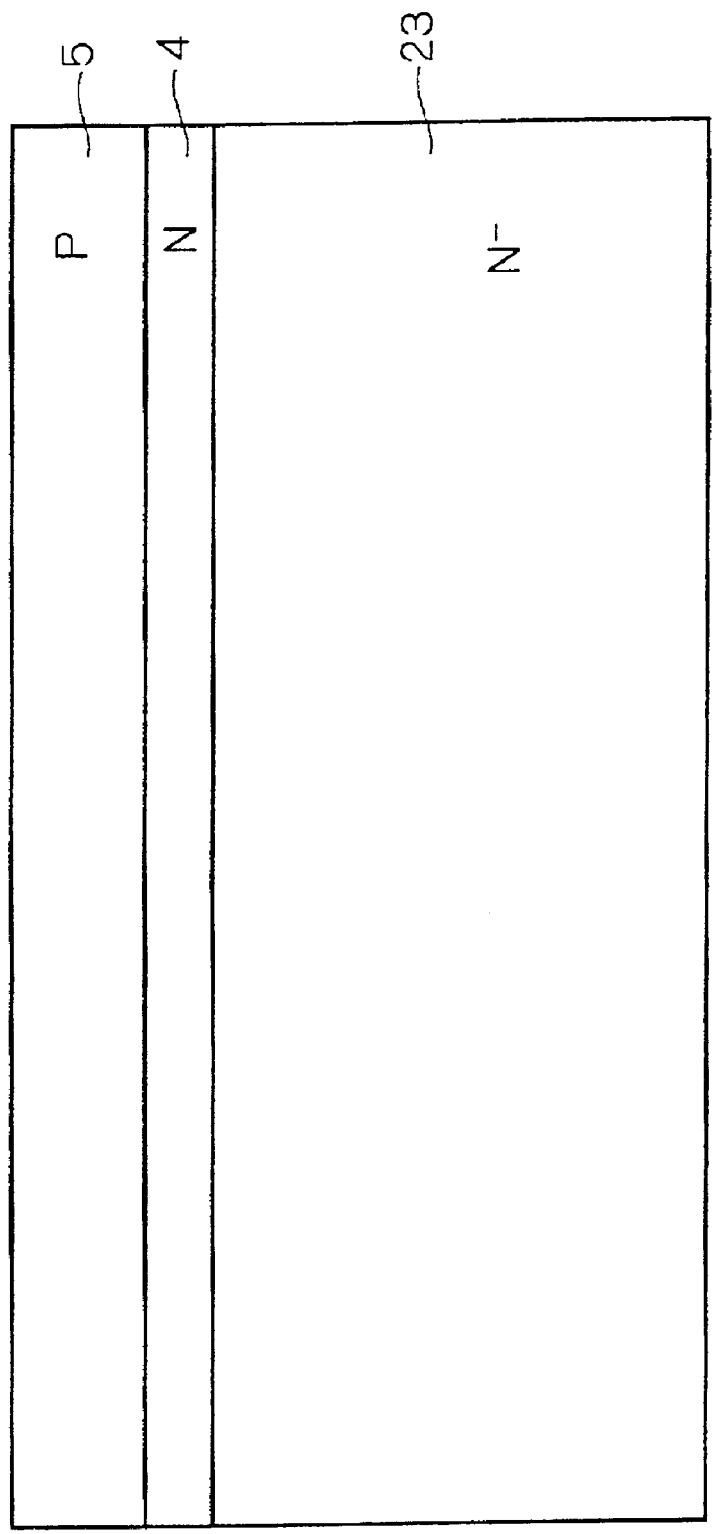

As shown in FIG. 14, subsequently, a P-type impurity is implanted over the whole surface of the N layer 4 and is then diffused to form a P base layer 5 on the N layer 4.

Figure 15:
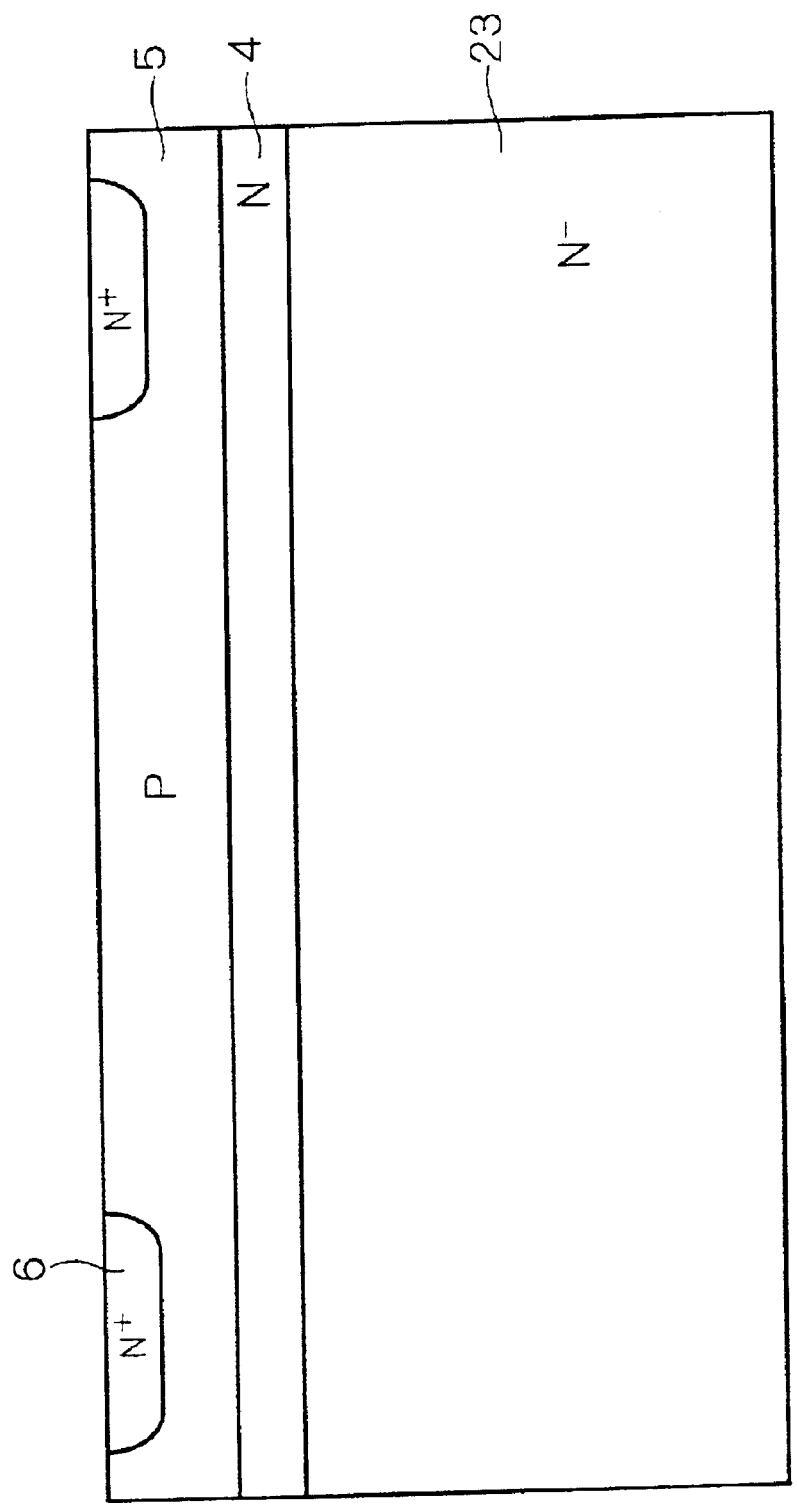

As shown in FIG. 15, next, an N-type impurity is selectively implanted from a surface of the P base layer 5 and is then diffused to form an N⁺ emitter region 6.

Figure 16:
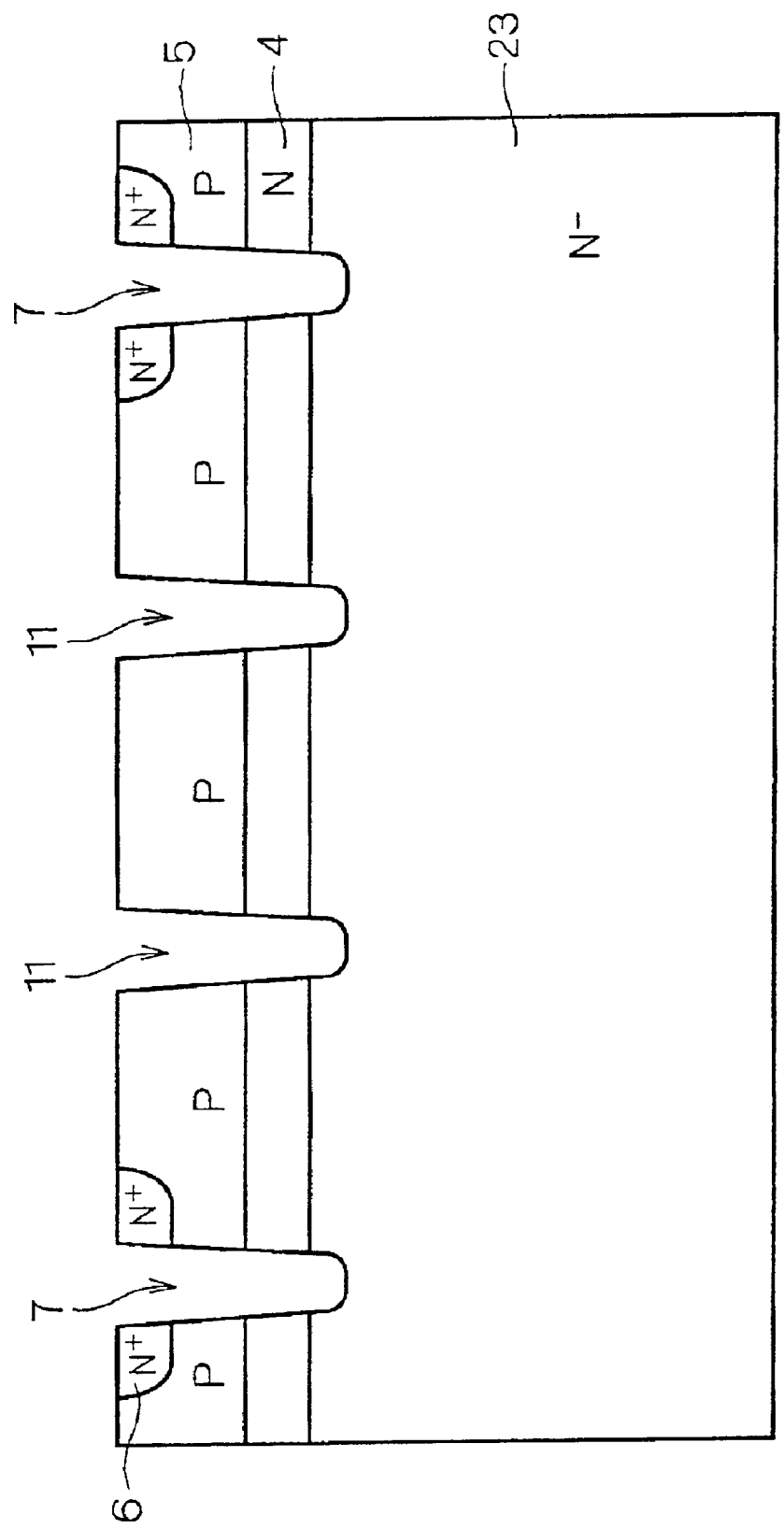

As shown in FIG. 16, then, a first trench 7 is formed through a central portion of the N⁺ emitter region 6, the P base layer 5 and the N layer 4 to an upper layer portion of the substrate 23 and a second trench 11 is provided through the P base layer 5 in which the N⁺ emitter region 6 is not formed and the N layer 4. In this case, the first trench 7 and the second trench 11 are formed with equal formation widths adjacently to each other and apart from each other and can be thus formed easily with equal depths. Thus, the first trench 7 and the second trench 11 can be formed at the same time so that manufacture can be carried out efficiently.

Figure 17:
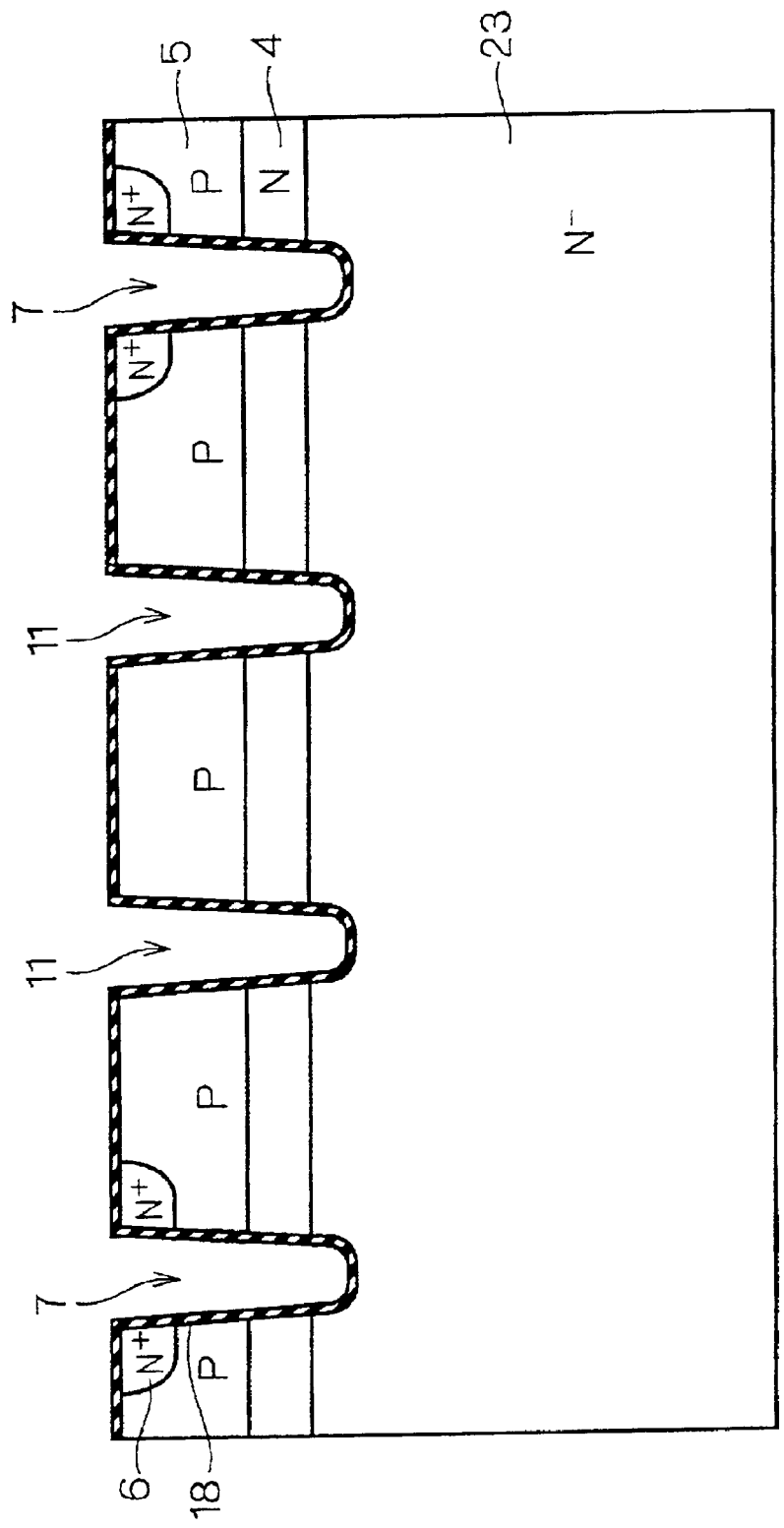

As shown in FIG. 17, then, an insulating film 18 is formed over the whole surface including internal wall surfaces of the first trench 7 and the second trench 11.

Figure 18:
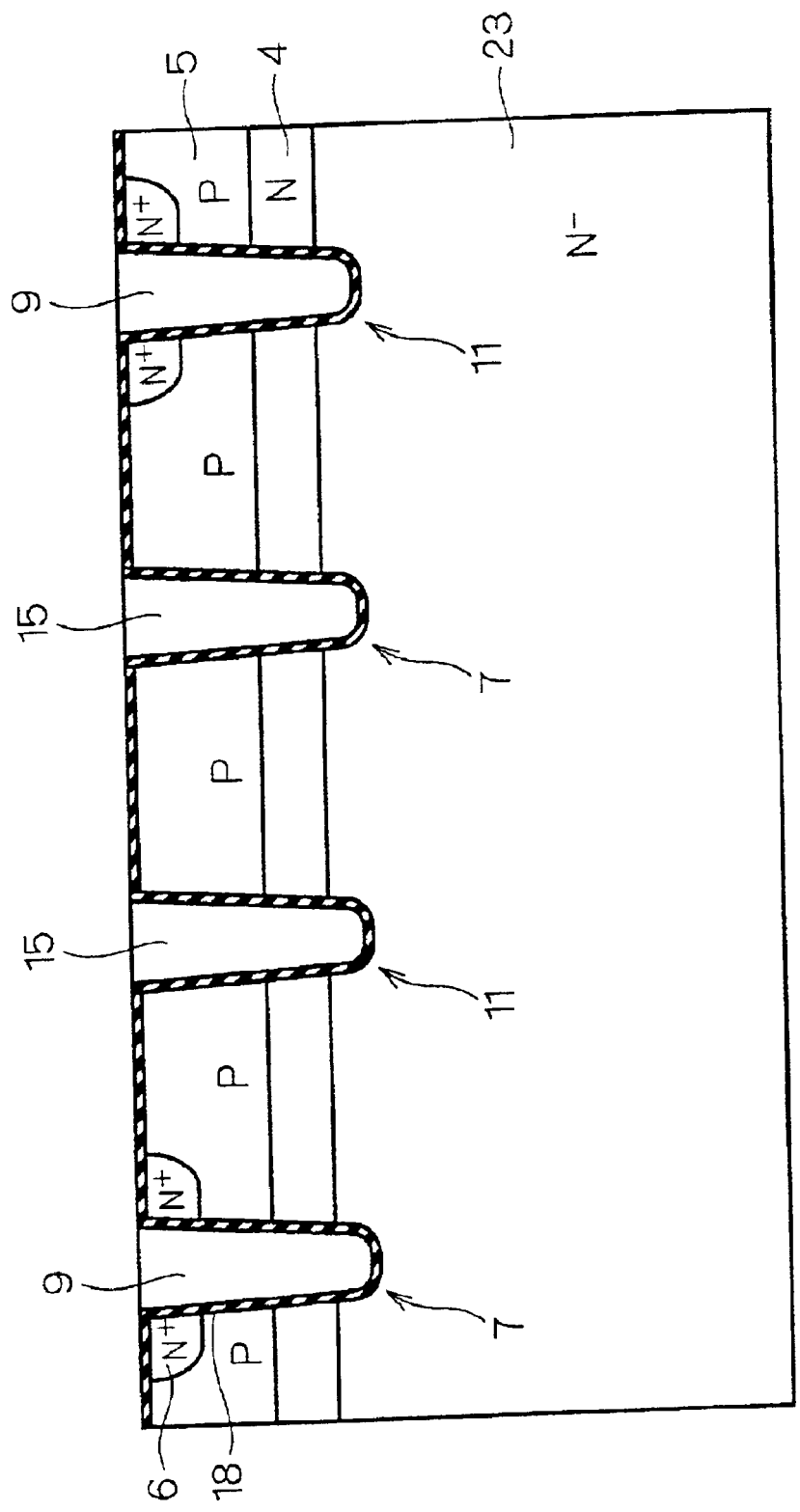

As shown in FIG. 18, subsequently, polysilicon to be an electric conductor is provided over the whole surface and is then etched. Consequently, a gate electrode 9 and a polysilicon region 15 are simultaneously formed in the first trench 7 and the second trench 11, respectively. Thus, the gate electrode 9 and the polysilicon region 15 are simultaneously formed of the same material. Consequently, the gate electrode 9 and the polysilicon region 15 can be formed efficiently.

Figure 19:
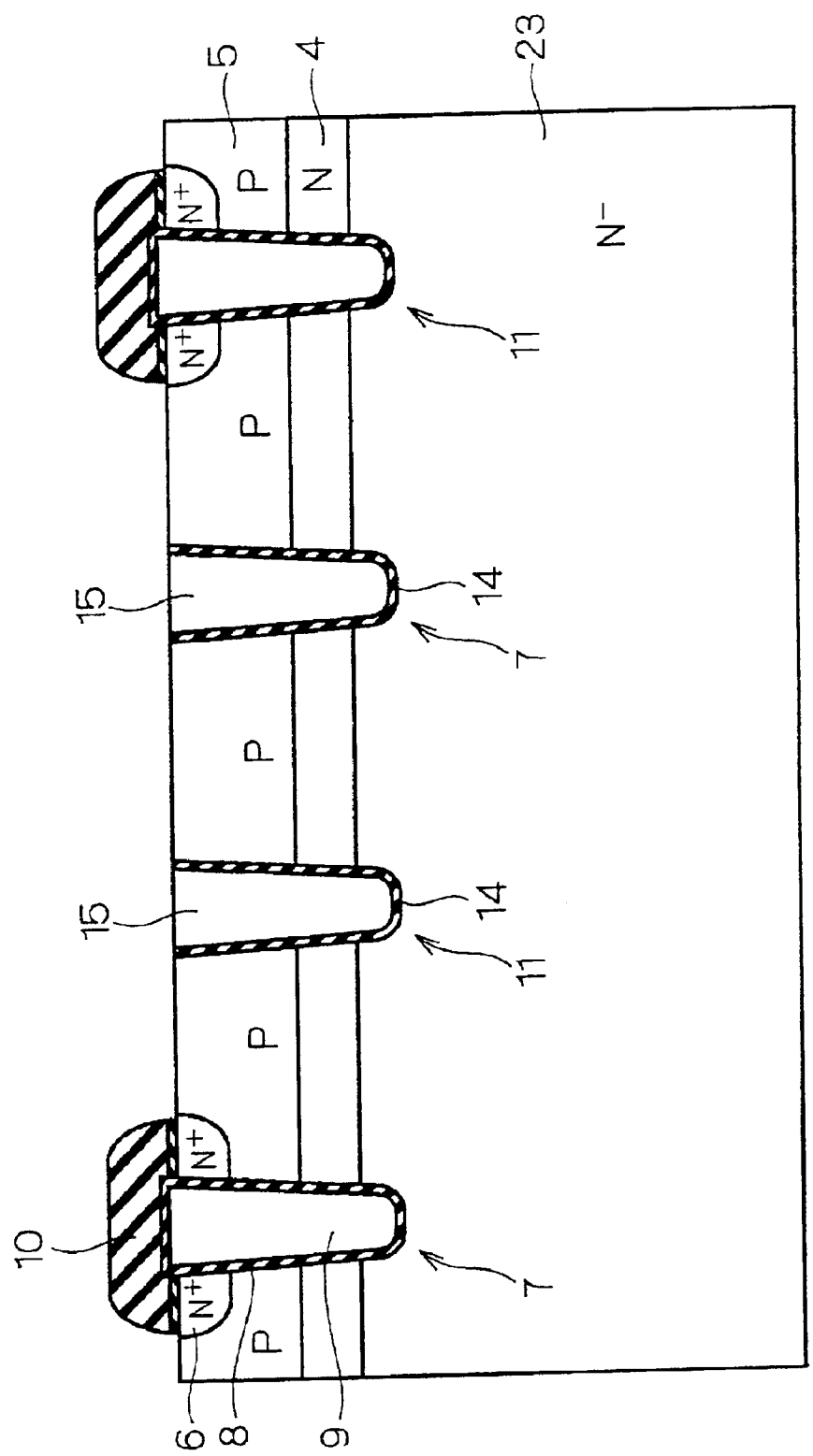

As shown in FIG. 19, thereafter, an insulating film is formed over the whole surface and is selectively etched to form an interlayer insulating film 10 on only a large part of the first trench 7 and the N⁺ emitter region 6.

In this case, a gate insulating film 8 and an insulating film 14 are completed. At the steps shown in FIGS. 17 and 19, thus, the gate insulating film 8 and the insulating film 14 are formed at the same time. Consequently, the gate insulating film 8 and the insulating film 14 can be formed efficiently.

Figure 20:
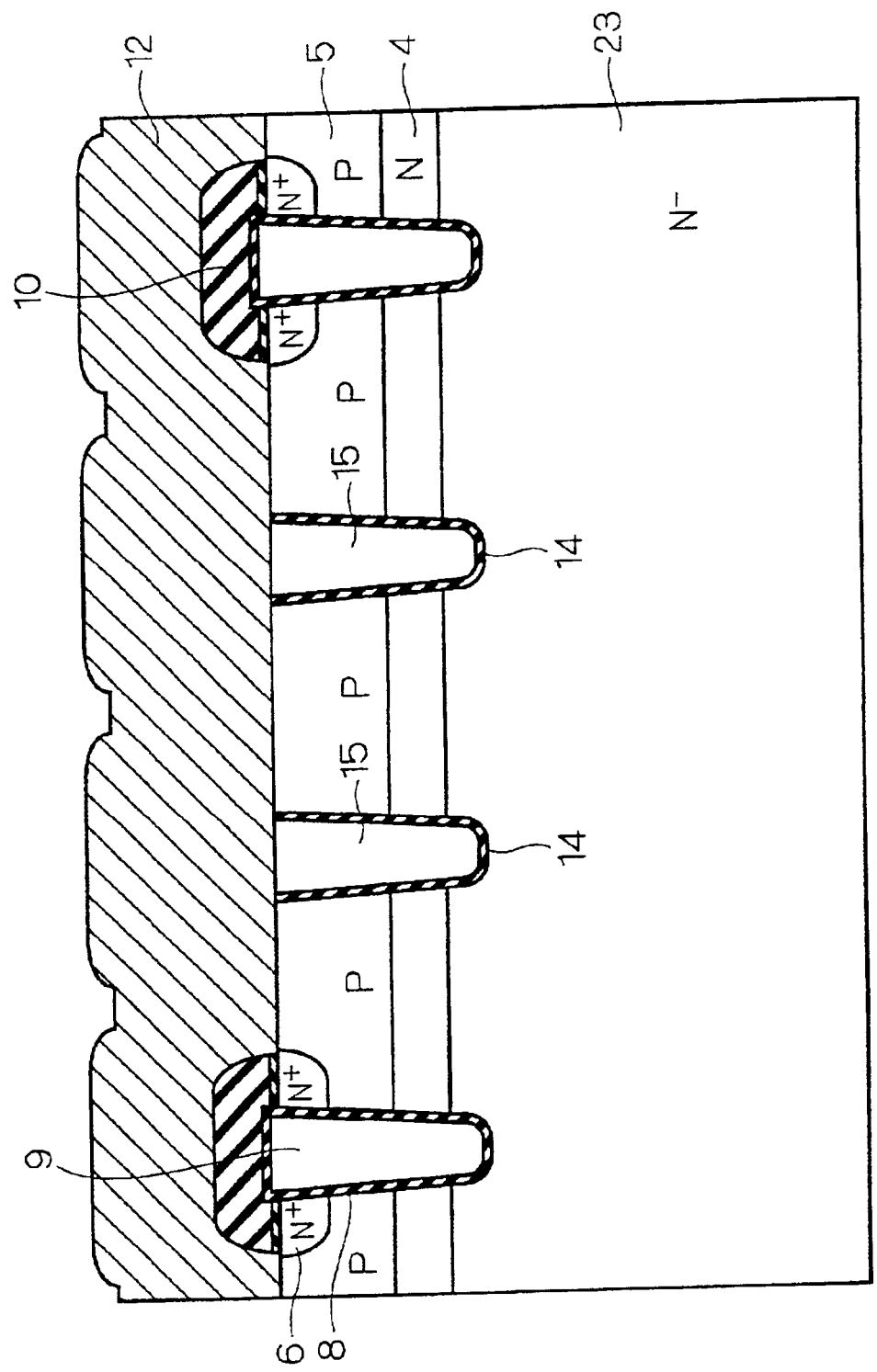

As shown in FIG. 20, next, an emitter electrode 12 is formed over the whole surface (including a surface of the N⁺ emitter region 6). Accordingly, the emitter electrode 12 is directly formed over a part of the N⁺ emitter region 6 and the almost whole surface of the P base layer 5.

A collector electrode is formed on a back face of the substrate 23 so that a CSTBT having the basic structure according to the first embodiment is completed, which is not shown.

In the case in which the structure according to another mode of the first embodiment is to be obtained, it is preferable that the substrate 23 should comprise the P⁺ substrate 1 and the N⁻ layer 3.

In the case in which the structures according to the first to third modes of the second embodiment are to be obtained, it is preferable that an N⁺ emitter region 6 corresponding to the first to third modes should be formed at the step shown in FIG. 18 and an interlayer insulating film 19 should be formed in place of the interlayer insulating film 10 at the step shown in FIG. 19, for example. In the case of the second and third modes, the second trench 11 is formed adjacently to a part of emitter extended regions 6b and 6c at the step shown in FIG. 19.

In the case in which the structures according to the first and second modes of the third embodiment are to be obtained, moreover, it is preferable that the steps of forming a P⁺ diffusion region 16 and a P⁺ diffusion region 17 should be inserted between the step shown in FIG. 18 and the step shown in FIG. 19, for example.

<Fifth Embodiment>

Figure 21:
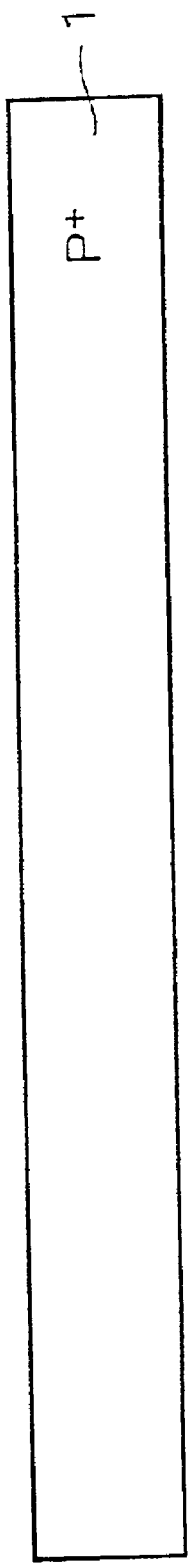
FIGS. 21 to 23 are sectional views showing a method of manufacturing a CSTBT according to a fifth embodiment.
Figure 22:
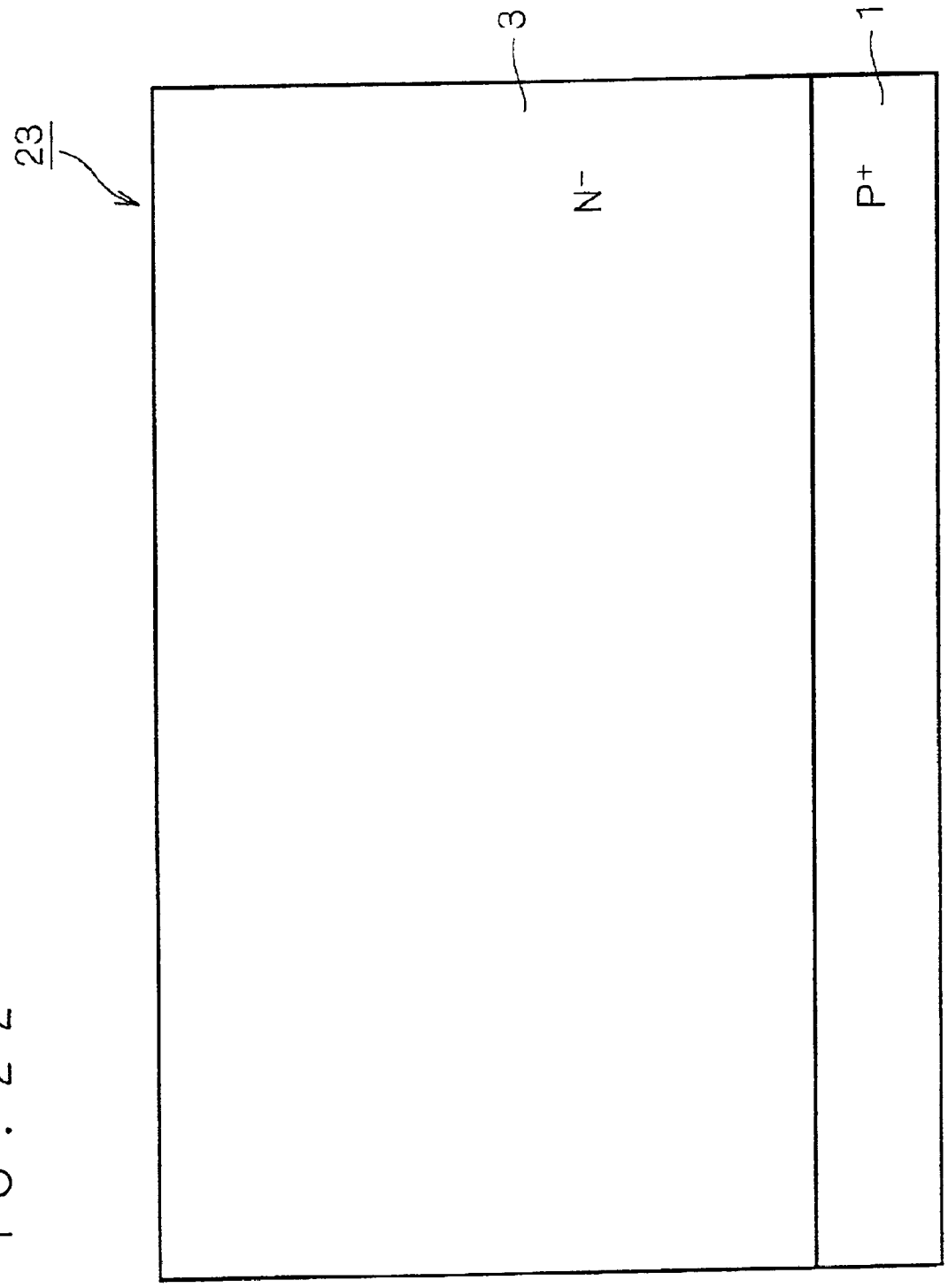
Figure 23:
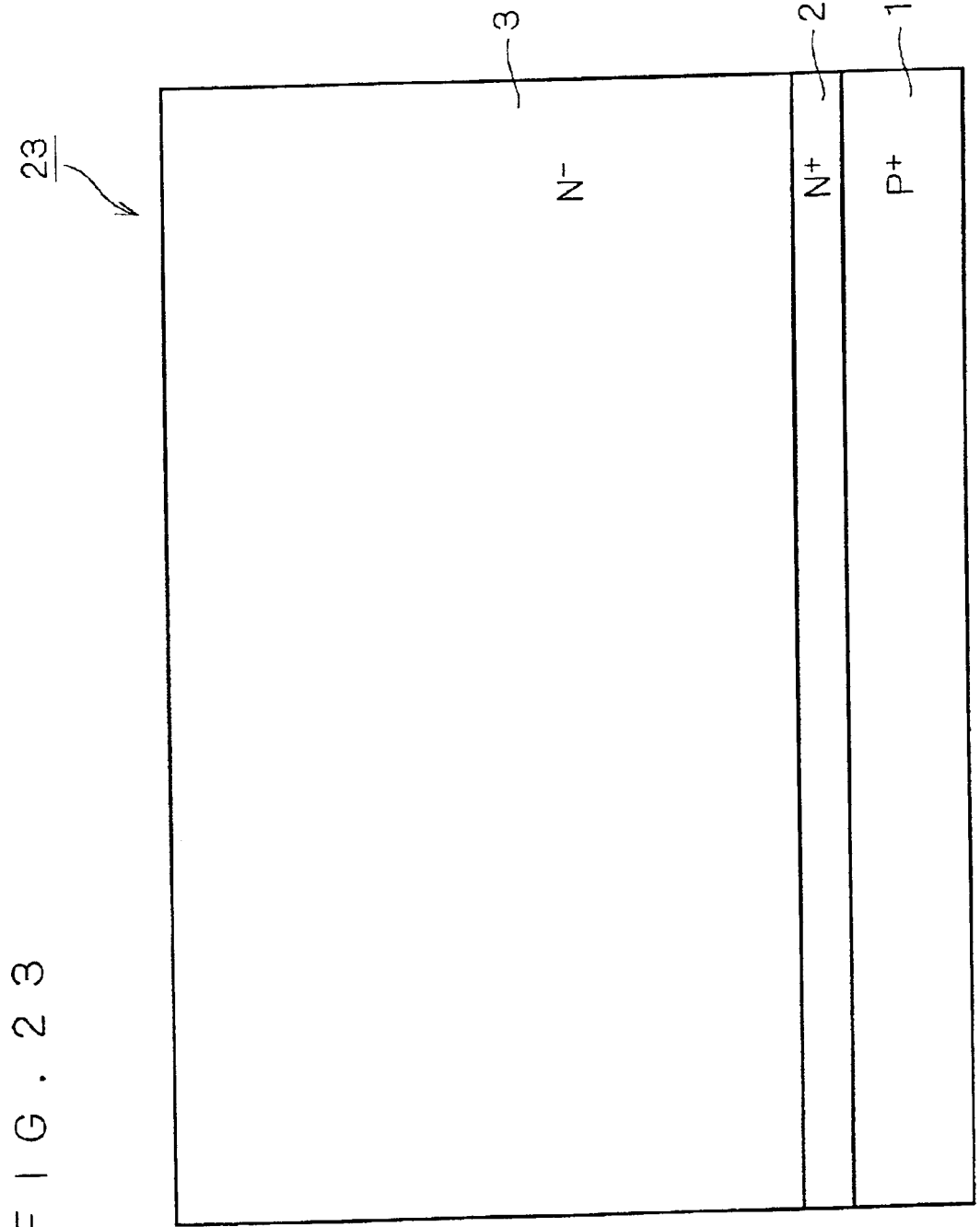

FIGS. 21 to 23 are views illustrating a method of manufacturing the substrate 23 shown in FIG. 12.

As shown in FIG. 21, first of all, a P⁺ substrate 1 such as a P-type silicon substrate is prepared.

As shown in FIG. 22, then, an N-type silicon layer to be an N⁻ layer 3 is formed on a back face (a top portion in the drawing) of the P⁺ substrate 1 by epitaxial growth, for example. As a result, it is possible to obtain the substrate 23 comprising the P⁺ substrate 1 and the N⁻ layer 3.

Through the steps according to the fourth embodiment shown in FIGS. 12 to 20, then, an IGBT cell is formed in an upper layer portion of the N⁻ layer 3. Thereafter, a collector electrode is formed on the back face (the top portion in the drawing) of the P⁺ substrate 1. Thus, a TIGBT can be completed (not shown).

After the step shown in FIG. 21, an N⁺ buffer layer 2 and an N⁻ layer 3 are sequentially formed on the back face (the top portion in the drawing) of the P+substrate 1 by the epitaxial growth or the like as shown in FIG. 23. Consequently, it is possible to obtain the substrate 23 comprising the P⁺ substrate 1, the N⁺ buffer layer 2 and the N⁻ layer 3.

According to the fifth embodiment, thus, the N⁻ layer 3 is formed by the epitaxial growth. Therefore, it is possible to form the N⁻ layer 3 with good controllability of an impurity concentration and a film thickness.

<Sixth Embodiment>

Figure 24:
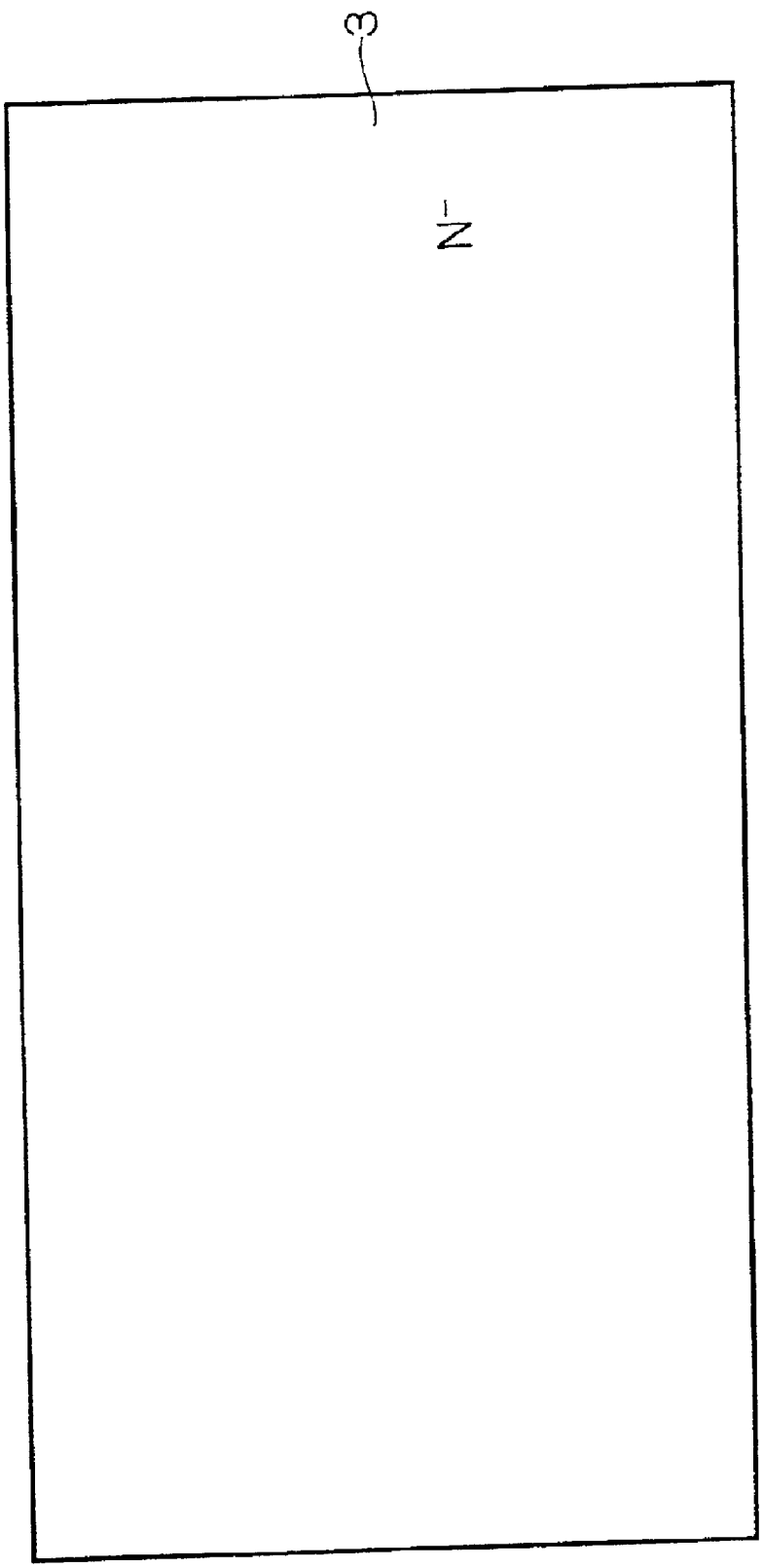
FIGS. 24 to 26 are sectional views showing a method of manufacturing a CSTBT according to a sixth embodiment.
Figure 25:
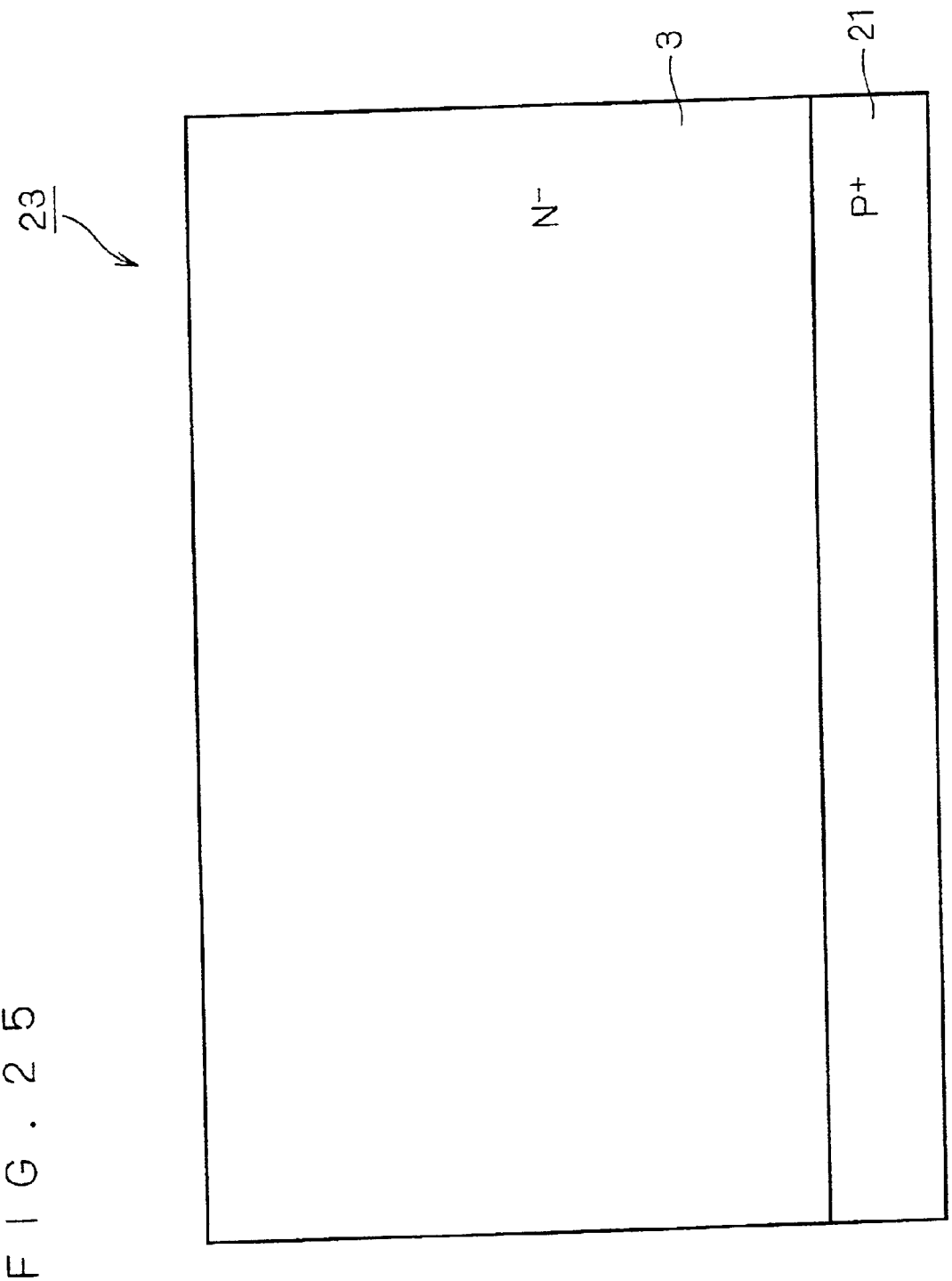

FIGS. 24 and 25 are sectional views showing a method of manufacturing a silicon substrate to obtain a CSTBT which is equivalent to the structure shown in FIG. 2.

As shown in FIG. 24, first of all, an N⁻ layer 3 is prepared.

As shown in FIG. 25, then, a P-type impurity is implanted into a back face of the N layer 3 and is then diffused. Consequently, a P-type silicon layer 21 to be a P⁺ substrate 1 is obtained. As a result, it is possible to obtain a substrate 23 comprising the N⁻ layer 3 and the P-type silicon layer 21.

Through the steps according to the fourth embodiment shown in FIGS. 12 to 20, subsequently, an IGBT cell is formed in an upper layer portion of the N⁻ layer 3. Thereafter, a collector electrode is formed on a back face of the P-type silicon layer 21. Thus, a TIGBT is completed (not shown).

The steps shown in FIGS. 24 and 25 can also be inserted in the middle of the steps according to the fourth embodiment shown in FIGS. 12 to 20.

Figure 26:
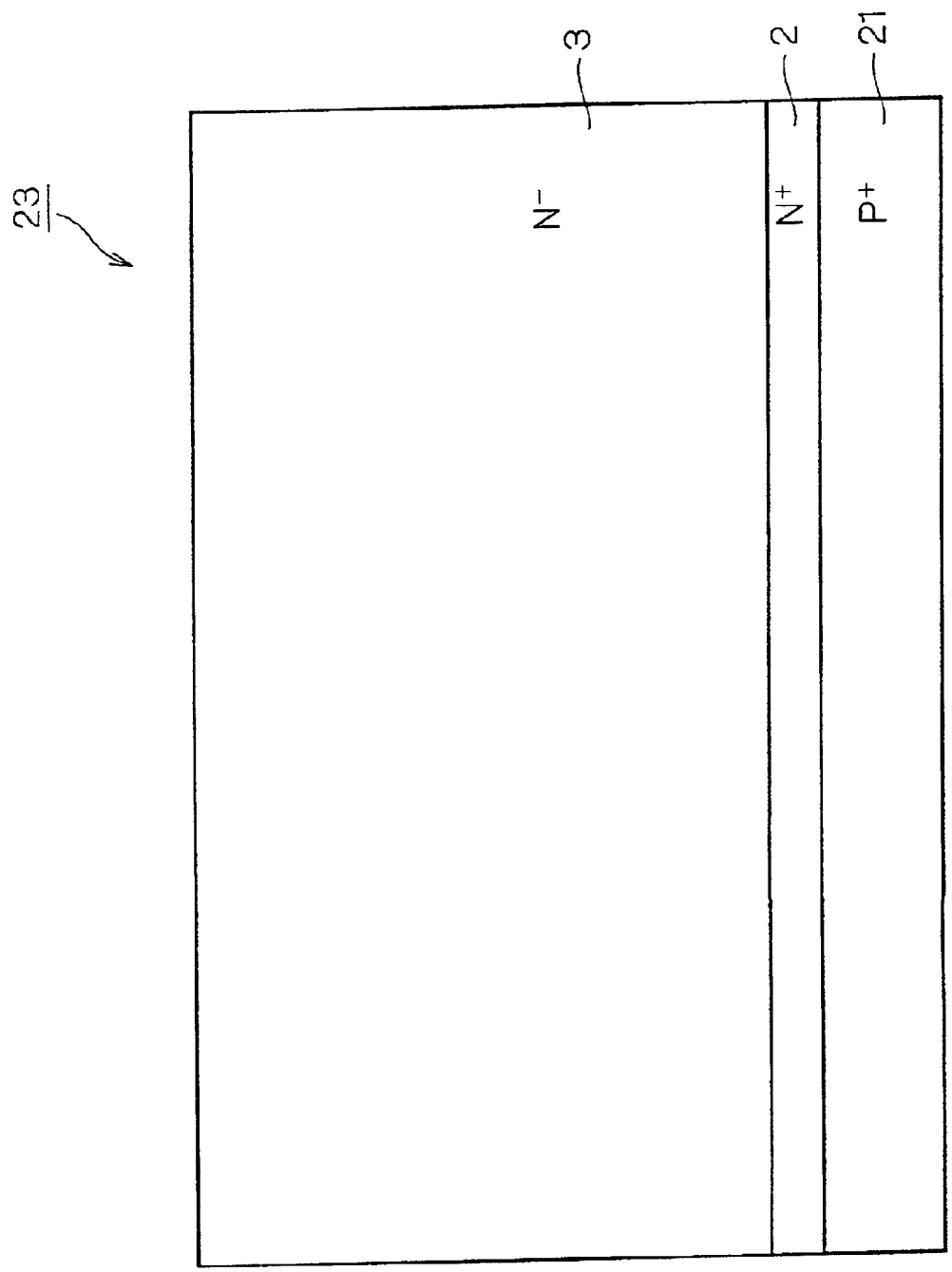

After the step shown in FIG. 25, as shown in FIG. 26, an N-type impurity is implanted shallowly from a back face of the substrate 23 and is then diffused to form an N⁺ buffer layer 2 in a lower layer portion of the substrate 23 and to then form the P-type silicon layer 21. Consequently, it is possible to obtain the substrate 23 comprising the P-type silicon layer 21, the N⁺ buffer layer 2 and the N⁻ layer 3.

<Others>

While the IGBT (CSTBT) having an NMOS structure has been described in the first to sixth embodiments, it is a matter of course that the present invention can also be applied to an IGBT having a PMOS structure.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a first semiconductor layer of a first conductivity type having first and second major surfaces;
   a second semiconductor layer of a second conductivity type formed on the first major surface of said first semiconductor layer;
   a third semiconductor layer of the second conductivity type formed on said second semiconductor layer;
   a fourth semiconductor layer of the first conductivity type formed on said third semiconductor layer;
   at least one first trench and at least one second trench arranged to penetrate through at least said fourth semiconductor layer from a surface of said fourth semiconductor layer such that a bottom part of an external wall of said at least one second trench is in direct contact with a region of the second conductivity type;
   a first semiconductor region of the second conductivity type selectively formed in said surface of said fourth semiconductor layer vicinal to said at least one first trench;
   a first insulating film formed on an internal wall of said at least one first trench;
   a first material serving as a control electrode buried in said at least one first trench and formed on said first insulating film;
   a second material formed in said at least one second trench, the second material not being a control electrode;
   a first main electrode electrically connected to said second material formed in said at least one second trench and to at least a part of said first semiconductor region and formed over a surface of said fourth semiconductor layer; and
   a second main electrode formed on the second major surface of said first semiconductor layer.

2. The semiconductor device according to claim 1, wherein a distance between said at least one first trench and said at least one second trench is 5 $\mu$m or less.

3. The semiconductor device according to claim 1, wherein
   said at least one first trench includes a trench formed in a predetermined direction along a surface of said fourth semiconductor layer,
   said at least one second trench includes a trench formed in said predetermined direction,
   said first semiconductor region includes a first section formed in a vicinity of said at least one first trench and a second section extended from said first section in such a direction as to go away from said at least one first trench, and
   said first main electrode is directly formed on said second section to carry out an electrical connection to said first semiconductor region.

4. The semiconductor device according to claim 3, wherein
   said first semiconductor region includes a third section which is further extended from said second section and is formed in a vicinity of said at least one second trench, and said first main electrode is further formed directly on said third section to carry out said electrical connection to said first semiconductor region.

5. The semiconductor device according to claim 4, wherein said second and third sections include a plurality of second and third sections respectively, and
   said plurality of third sections are selectively formed in the vicinity of said at least one second trench.

6. The semiconductor device according to claim 1, further comprising:
   a second semiconductor region of the first conductivity type formed in said surface of said fourth semiconductor layer contiguous to said at least one second trench, said second semiconductor region having a concentration of an impurity of the first conductivity type set to be higher than that of said fourth semiconductor layer.

7. The semiconductor device according to claim 6, wherein
   said concentration of said impurity of the first conductivity type in said second semiconductor region is set to be higher than a concentration of an impurity of the second conductivity type in said first semiconductor region.

8. The semiconductor device according to claim 1, further comprising:
   a plurality of second trenches.

9. The semiconductor device according to claim 1, wherein
   said at least one first trench and said at least one second trench have equal formation widths.

10. The semiconductor device according to claim 1, further comprising:
    a second insulating film formed on an internal wall of said at least one second trench.

11. The semiconductor device according to claim 10, further comprising a conductive region buried in said at least one second trench and formed on said second insulating film.

12. The semiconductor according to claim 11, wherein said first main electrode is directly formed on said conductive region.

13. The semiconductor device according to claim 1, further comprising:
    a sixth semiconductor layer of the second conductivity type formed between said first semiconductor layer and said second semiconductor layer, said sixth semiconductor layer having a concentration of an impurity of the second conductivity type higher than that of said second semiconductor layer.

14. The semiconductor device according to claim 1, wherein
    said first semiconductor region is not vicinal to said at least one second trench.

15. The semiconductor device according to claim 14, wherein the first main electrode is formed in direct contact over an entire top surface of said fourth semiconductor layer around said at least one second trench.

16. The semiconductor device according to claim 15, wherein the first main electrode is formed in direct contact over entire said top surface of said fourth semiconductor layer between said at least one first trench and said at least one second trench.

17. The semiconductor device according to claim 1, further comprising:
    a plurality of first trenches, wherein said at least one second trench is provided between two adjacent first trenches.

18. The semiconductor device according to claim 17, further comprising:
a plurality of second trenches provided between two adjacent first trenches.

19. The semiconductor device according to claim 18, wherein the first main electrode is formed in direct contact over an entire top surface of said fourth semiconductor layer among said plurality of second trenches.

20. The semiconductor device according to claim 19, wherein the first main electrode is formed in direct contact over entire said top surface of said fourth semiconductor layer between each first trench of said plurality of first trenches and each second trench of said plurality of second trenches.

21. The semiconductor device according to claim 17, wherein the first main electrode is formed in direct contact over an entire top surface of said fourth semiconductor layer around said at least one second trench.

22. The semiconductor device according to claim 21, wherein the first main electrode is formed in direct contact over entire said top surface of said fourth semiconductor layer between each first trench of said plurality of first trenches and said at least one second trench.

23. The semiconductor device according to claim 1, wherein the first main electrode is formed in direct contact over an entire top surface of said fourth semiconductor layer around said at least one second trench.

24. The semiconductor device according to claim 23, wherein the first main electrode is formed in direct contact over entire said top surface of said fourth semiconductor layer between said at least one first trench and said at least one second trench.

25. The semiconductor device according to claim 1, wherein
said first material is identical to said second material.

* * * * *